(12) United States Patent
Isobe et al.

(10) Patent No.: US 7,489,063 B2
(45) Date of Patent: Feb. 10, 2009

(54) THIN FILM PIEZOELECTRIC BULK ACOUSTIC WAVE RESONATOR AND RADIO FREQUENCY FILTER USING THE SAME

(75) Inventors: Atsushi Isobe, Kodaira (JP); Kengo Asai, Hachioji (JP); Hisanori Matsumoto, Kokubunji (JP); Nobuhiko Shibagaki, Kokubunji (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 0 days.

(21) Appl. No.: 11/627,858

(22) Filed: Jan. 26, 2007

(65) Prior Publication Data

US 2008/0024042 A1    Jan. 31, 2008

(30) Foreign Application Priority Data

Jul. 31, 2006    (JP) .............................. 2006-208105

(51) Int. Cl.
    *H01L 41/08* (2006.01)
(52) U.S. Cl. ...................... 310/312; 310/365; 310/320
(58) Field of Classification Search ................ 310/320, 310/324, 312
    See application file for complete search history.

(56) References Cited

U.S. PATENT DOCUMENTS

| 4,050,126 | A | * | 9/1977 | Ikeno et al. ................. 29/25.35 |
| 4,642,505 | A | * | 2/1987 | Arvanitis ..................... 310/312 |
| 5,912,601 | A |   | 6/1999 | Unami et al. ................. 333/187 |
| 6,604,266 | B1 | * | 8/2003 | Tajima et al. ............... 29/25.35 |
| 6,617,249 | B2 |   | 9/2003 | Ruby et al. .................. 438/689 |
| 6,657,363 | B1 | * | 12/2003 | Aigner ........................ 310/324 |

(Continued)

FOREIGN PATENT DOCUMENTS

DE    102 41 425 A1    3/2004

(Continued)

OTHER PUBLICATIONS

R. Aigner et al., "Bulk-Acoustic-Wave Filters: Performance Optimization and Volume Manufacturing," 2003 IEEE MTT-S Digest, pp. 2001-2004.

(Continued)

*Primary Examiner*—Mark Budd
(74) *Attorney, Agent, or Firm*—Miles & Stockbridge P.C.

(57) ABSTRACT

An object of the present invention is to provide an inexpensive thin film piezoelectric bulk acoustic wave resonator that allows fine-tuning of a resonant frequency. Another object is to provide an inexpensive filter with dramatically improved frequency characteristics, using thin film piezoelectric bulk acoustic wave resonators that can be formed on one substrate. A thin film piezoelectric bulk acoustic wave resonator of the present invention has a laminated structure including a piezoelectric thin film, and a first metal electrode film and a second metal electrode film between which part of the piezoelectric thin film is sandwiched; the first metal electrode film has a plurality of holes formed on an electrode plane opposite to the second metal electrode film and having a depth equivalent to at least the thickness of the first metal electrode film; and if a combined thickness of top and bottom electrode layers and the piezoelectric thin film is ht, the covering ratio σ of the electrode plane of the first metal electrode film satisfies a condition 0<σ<1 for every 1.28 ht pitch.

18 Claims, 33 Drawing Sheets

U.S. PATENT DOCUMENTS

| | | | |
|---|---|---|---|
| 6,903,496 B2 * | 6/2005 | Takeuchi et al. | 310/363 |
| 7,057,476 B2 * | 6/2006 | Hwu | 333/187 |
| 7,320,164 B2 * | 1/2008 | Yamada et al. | 29/25.35 |
| 2002/0121405 A1 | 9/2002 | Ruby et al. | |
| 2003/0193269 A1 | 10/2003 | Jang et al. | |
| 2004/0017130 A1 | 1/2004 | Wang et al. | |

FOREIGN PATENT DOCUMENTS

| | | |
|---|---|---|
| EP | 1 528 037 A | 5/2005 |
| JP | 10-84244 | 3/1998 |
| JP | 2002-335141 | 11/2002 |

OTHER PUBLICATIONS

L. Wang et al., "Method of Fabricating Multiple-frequency Film Bulk Acoustic Resonators (FBARs) In A Single Chip," IEEE Frequency Control Symposium Digest, 2006, p. 179.

* cited by examiner $C1 = C0 \times \sigma$

C1≒C0

THIN FILM PIEZOELECTRIC BULK ACOUSTIC WAVE RESONATOR AND RADIO FREQUENCY FILTER USING THE SAME

CLAIM OF PRIORITY

The present application claims priority from Japanese application JP 2006-208105 filed on Jul. 31, 2006, the content of which is hereby incorporated by reference into this application.

FIELD OF THE INVENTION

The present invention relates to a resonator using the piezoelectric and/or anti-piezoelectric effect of a piezoelectric thin film and also taking advantage of the resonance of a bulk elastic wave, hereinafter referred to as a thin film piezoelectric bulk wave resonator, and a radio frequency filter using the same.

BACKGROUND OF THE INVENTION

An FBAR (Film Bulk Acoustic Wave Resonator) and an SMR (Solidly Mounted Resonator) are well known as thin film piezoelectric bulk acoustic wave resonators suitable for a radio frequency filter.

U.S. Pat. No. 6,617,249B2 discloses an FBAR-type thin film bulk acoustic wave resonator that allows resonators with different resonant frequencies to be fabricated on the same substrate by forming a surface loading layer, which covers a surface electrode layer and is patterned thereon, on the surface electrode layer.

U.S. Pat. No. 5,912,601 discloses a piezoelectric resonator composed of a laminate that is formed by a plurality of laminated piezoelectric layers between which a substrate is interposed that has a plurality of electrodes with different areas.

"Aigner et al., Bulk-Acoustic Wave Filters: Performance Optimization and Volume Manufacturing, 2003 IEEE MTT-S Digest, pp. 2001-2004" describes an SMR-type thin film bulk acoustic filter that shifts resonant frequency by adding an auxiliary metal layer on top of a surface electrode layer, in order to fabricate a resonator with a different frequency.

"Wang et al., Method of Fabricating Multiple-frequency Film Bulk Acoustic Resonator (FBARs) in a Single Chip, 2006, IEEE Frequency Control Symposium Digest, p. 179" describes a method of enabling the adjustment of resonant frequency by providing an additional adjusting layer on top of a surface electrode layer and thereby controlling the width of the adjusting layer or pitch adjusting pattern.

SUMMARY OF THE INVENTION

Generally, a thin film piezoelectric bulk acoustic wave resonator with resonant frequency 1 MHz or higher suitable for a radio frequency filter includes: a piezoelectric thin film formed by a coating apparatus; a resonator portion composed of a first metal thin film and a second metal thin film that sandwich at least part of the piezoelectric thin film; and an elastic wave reflector. The first metal thin film functions as a top electrode and the second metal thin film functions as a bottom electrode. The piezoelectric thin film is polarized in the thickness direction. An AC electric field generated by an AC voltage applied between the top electrode and the bottom electrode causes an elastic wave (i.e., expansion and contraction in the thickness direction of the piezoelectric thin film) due to piezoelectric/anti piezoelectric effect. The resonator portion composed of the piezoelectric thin film, top electrode, and bottom electrode is sandwiched horizontally by the elastic wave reflectors. The interface between solid and gas (or vacuum) acts as an efficient elastic wave reflector. In an FBAR, gas (or vacuum) atmosphere is present above and below the resonator. In an SMR, gas (or vacuum) atmosphere is present above the top electrode and a Bragg reflector is disposed below the bottom electrode. Hence, an elastic wave generated in the piezoelectric thin film is confined in the resonator.

The elastic wave excited resonates when the half wavelength thereof coincides with the total film thickness of the piezoelectric thin film, top electrode, and bottom electrode. The resonant frequency is the ratio of the velocity to wavelength (twice the total film thickness of the piezoelectric thin film and bottom electrode) of an elastic wave.

The thin film piezoelectric bulk acoustic wave resonators for radio frequencies disclosed in the U.S. Pat. No. 6,617,249B2, U.S. Pat. No. 5,912,601, "Aigner et al., Bulk-Acoustic Wave Filters: Performance Optimization and Volume Manufacturing, 2003 IEEE MTT-S Digest, pp. 2001-2004" and "Wang et al., Method of Fabricating Multiple-frequency Film Bulk Acoustic Resonator (FBARs) in a Single Chip, 2006, IEEE Frequency Control Symposium Digest, p. 179" have the following problems.

A filter, typically a ladder filter, using a thin film piezoelectric bulk acoustic wave resonator realizes a band pass filter by nearly matching the series resonant frequency of a series arm resonator and the parallel resonant frequency of a parallel arm resonator. Accordingly, it is necessary to form thin film piezoelectric bulk acoustic wave resonators with different resonant frequencies on the same substrate.

Since a resonant frequency is controlled by film thickness, in order to form a pair of thin film piezoelectric bulk acoustic wave resonators with different resonant frequencies, it is necessary to form the top electrode on each of the two resonators and then coat an additional loading film on the electrode on one resonator, leaving the top electrode on the other resonator as it is, as disclosed in the U.S. Pat. No. 6,617,249B2 and "Aigner et al., Bulk-Acoustic Wave Filters: Performance Optimization and Volume Manufacturing, 2003 IEEE MTT-S Digest, pp. 2001-2004". This increases the number of fabrication steps and results in cost increase.

Also, in the configuration disclosed in the U.S. Pat. No. 6,617,249B2 or "Aigner et al., Bulk-Acoustic Wave Filters: Performance Optimization and Volume Manufacturing, 2003 IEEE MTT-S Digest, pp. 2001-2004", an extremely high precision is required for the film thickness of the loading film to determine frequency difference, which requires an expensive coating apparatus and thereby increases the cost.

The configuration of "Wang et al., Method of Fabricating Multiple-frequency Film Bulk Acoustic Resonator (FBARs) in a Single Chip, 2006, IEEE Frequency Control Symposium Digest, p. 179" allows the tuning of a resonant frequency by controlling the width and/or pitch of an adjustment layer during the patterning process. However, as with the techniques disclosed in the U.S. Pat. No. 6,617,249B2 and "Aigner et al., Bulk-Acoustic Wave Filters: Performance Optimization and Volume Manufacturing, 2003 IEEE MTT-S Digest, pp. 2001-2004", it is necessary to coat an additional film on the top electrode and hence the same number of steps as in the methods of the U.S. Pat. No. 6,617,249B2 and "Aigner et al., Bulk-Acoustic Wave Filters: Performance Optimization and Volume Manufacturing, 2003 IEEE MTT-S Digest, pp. 2001-2004" are required, thus resulting in cost increase.

Meanwhile, in the piezoelectric resonator disclosed in U.S. Pat. No. 5,912,601, a plurality of electrode formed between a plurality of piezoelectric layers constituting a laminate base have different areas. According to FIG. 5B of this document, it is possible to make the areas different from each other by forming an electrode 14 on the main surface of a piezoelectric 12a and forming holes 15 on the electrode 14.

On the other hand, U.S. Pat. No. 5,912,601 states as follows in the paragraph of column 2, lines 61 to 67.

"In the longitudinal basic vibration, a stronger driving force is required at a portion of he base member located closer to the center thereof because of the large mass of this portion as compared to an end portion of the base member. Therefore, the piezoelectric resonator has an insufficiently large electromechanical coupling coefficient and thus ΔF is not sufficiently large."

Hence, according to this document, it is possible to further increase the ΔF compared with the piezoelectric resonators having uniform opposite areas and thereby obtain a broadband piezoelectric resonator, by forming a plurality of electrodes with different areas between a plurality of piezoelectric layers. Thus, the invention of U.S. Pat. No. 5,912,601 is intended to obtain a broadband piezoelectric resonator having laminated structure.

Meanwhile, the resonant frequency of a bulk wave resonator is determined by the bulk thickness (the distance between the outer surfaces of two electrodes sandwiching a piezoelectric layer), and as the bulk becomes thicker the resonant frequency drops. Therefore, if the piezoelectric resonator is composed of laminate material, a resonant frequency at several hundreds of kHz can be obtained at most, as disclosed in Table 4 of the U.S. Pat. No. 5,912,601. At any rate, this patent document gives no consideration to the issue of enabling the fine-tuning of resonant frequency without increasing the fabrication steps for piezoelectric resonators used for radio frequency band.

Based on the conventional arts and problems with them described above, the inventors of the present invention has devised unique resonator configurations to overcome the problems with the conventional arts in the thin film piezoelectric bulk acoustic wave resonator having about several GHz resonant frequencies.

The principal object of the present invention is to provide a thin film piezoelectric bulk acoustic wave resonator allowing the fine-tuning of resonant frequency and resolving these problems and a radio frequency filter using that resonator, without increasing the fabrication steps.

A typical example of the present invention is a thin film piezoelectric bulk acoustic wave resonator having a laminated structure, said laminated structure comprising: a piezoelectric thin film; a first metal electrode film; and a second metal electrode film between which at least part of the piezoelectric thin film is sandwiched, wherein the first metal electrode film has a hole structure including a plurality of holes with a depth at least equivalent to the thickness of the first metal electrode film, whereby the resonator has a resonant frequency at which an acoustic wave excited by the piezoelectric thin film cannot identify the holes of the hole structure individually.

According to the present invention, it is possible to fine-tune a resonant frequency by patterning the plurality of holes formed on the first metal thin film with a photomask and exposure process.

In other words, it is possible to form a plurality of thin film piezoelectric bulk acoustic wave resonators having different resonant frequencies without increasing the steps in the process of forming the top electrode, by adjusting the covering ratio of the top electrode of each resonator during the fabrication of a plurality of thin film piezoelectric bulk acoustic wave resonators on the same substrate.

DETAILED DESCRIPTION OF THE PREFERRED EMBODIMENTS

A thin film piezoelectric bulk acoustic wave resonator according to the present invention is described below in more detail with reference to some preferred embodiments shown in the accompanying drawings.

The present invention applies to an FBAR or an SMR whose resonant frequency is 1 MHz or higher and also depends on the thickness of a film of the resonator. The descriptions of the embodiments will be made using the FBAR and SMR as examples as appropriate.

Embodiment 1

Figure 1:
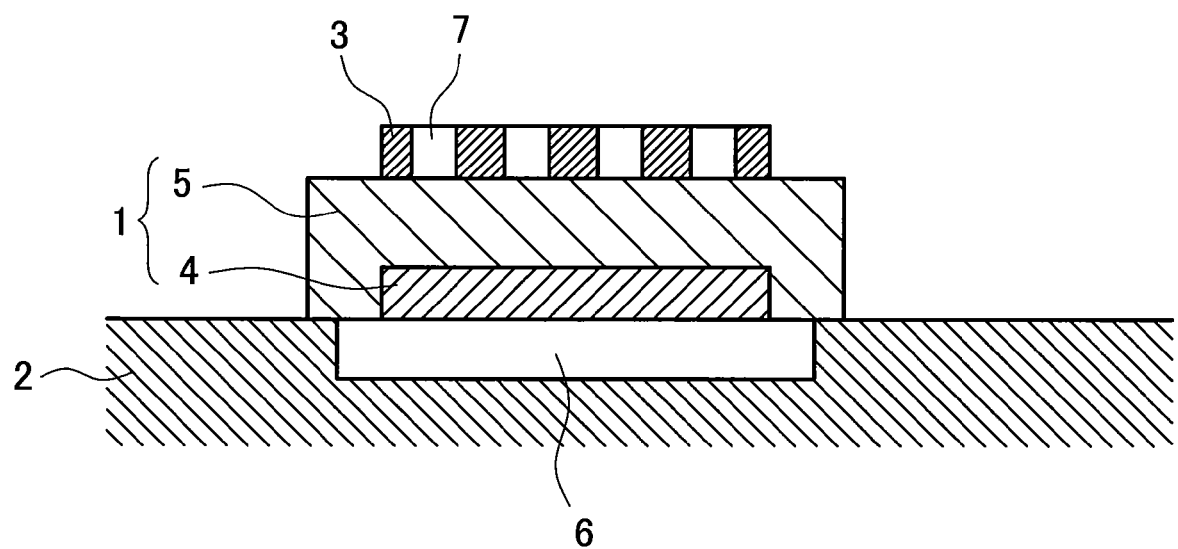
FIG. 1 is a longitudinal cross sectional view of a thin film piezoelectric bulk acoustic wave resonator to explain a first embodiment of the present invention.
Figure 2:
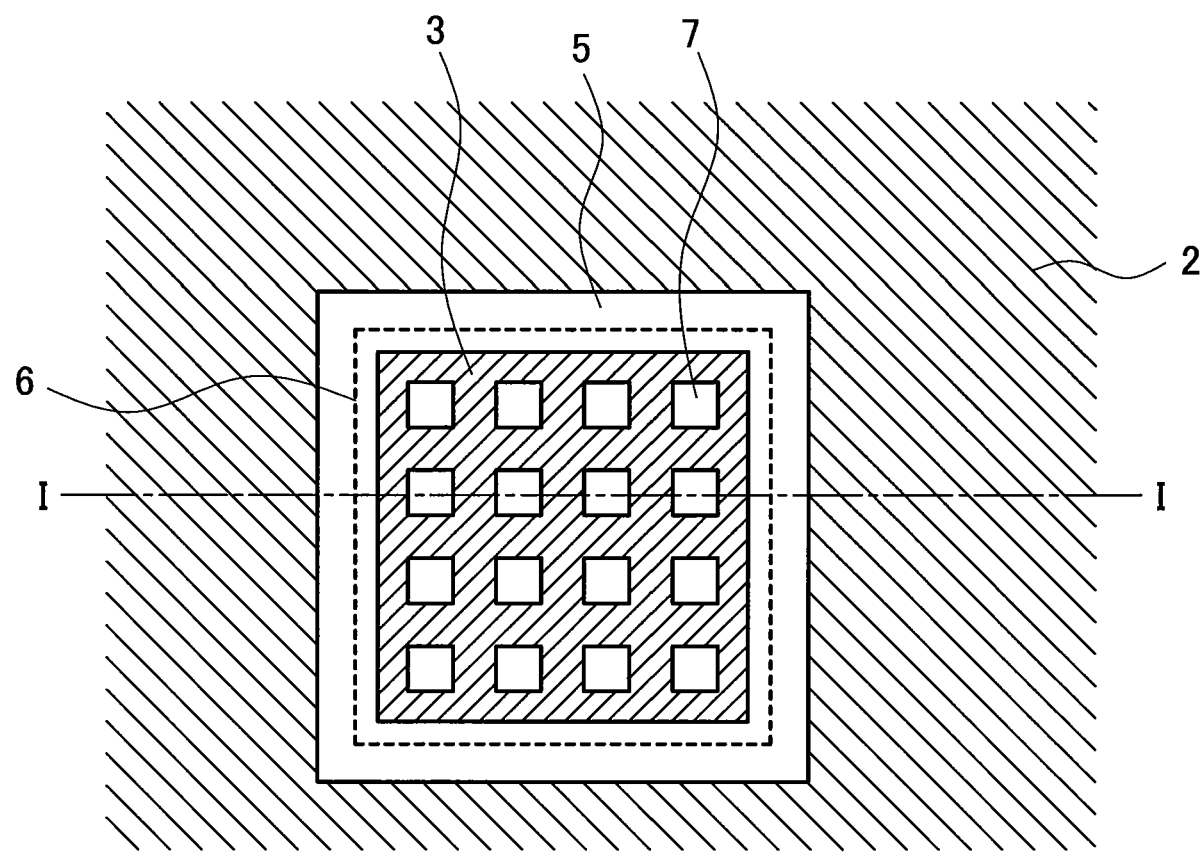
FIG. 2 is a schematic top view of a thin film piezoelectric bulk acoustic wave resonator to explain the first embodiment of the present invention.
Figure 3:
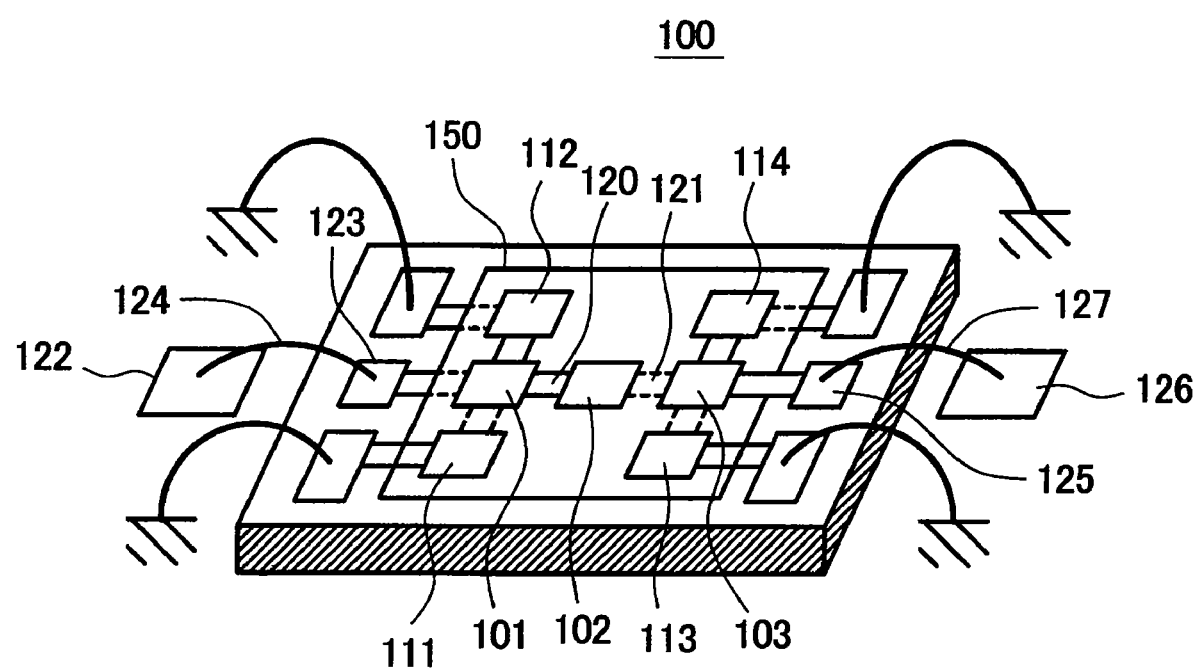
FIG. 3 is a perspective view of a radio frequency filter showing schematically an example in which a radio frequency filter employing the thin film piezoelectric bulk acoustic wave resonator of the first employment is formed on a single substrate.

Referring to FIGS. 1 and 3, a thin film piezoelectric bulk acoustic wave resonator according to a first embodiment of the present invention is described. FIG. 1 is a schematic cross-sectional view of the thin film piezoelectric bulk acoustic wave resonator of the first embodiment and shows the I-I cross section of FIG. 2. FIG. 2 is a schematic top view of the thin film piezoelectric bulk acoustic wave resonator of the first embodiment.

An FBAR-type thin film piezoelectric bulk acoustic wave resonator 1 is formed on an insulating substrate 2. A resonator portion of this FBAR-type piezoelectric bulk acoustic wave resonator 1 has a laminated structure (layer thickness "ht") including a piezoelectric material (a piezoelectric thin film) 5 and a pair of a top electrode (a first metal electrode film) 3 and a bottom electrode (a second metal electrode film) 4 sandwiching at least a portion of the piezoelectric material.

In this embodiment, the top electrode (film thickness "hu") 3 and the bottom electrode (film thickness "hd") 4 are each composed of a molybdenum film with square plane shape formed by a coating apparatus, and the piezoelectric material (film thickness "hp") 5 is composed of an aluminum nitride. Needless to say, other conducting materials, such as Cu and Al, may be used for the top electrode 3 and the bottom electrode 4.

The coating apparatus described herein is typically a sputtering apparatus, a deposition apparatus, or a CVD apparatus, which forms a film either by depositing molecules, atoms, ions, or a cluster thereof directly on a substrate, or by depositing them by means of chemical reaction. The thin film described herein is a film formed by the coating apparatus, and does not include a sintered material formed by sintering and a bulk material formed by the hydrothermal synthesis method, the Czochralski method, or the like, regardless of film thickness.

The top electrode 3 faces the corresponding bottom electrode 4 with the piezoelectric thin film 5 therebetween. However, since the location and shape of extraction lines provided at each periphery of the top electrode 3 and the bottom electrode 4 are different from each other, the entire planer shapes of both electrodes are not always the same.

In the present invention, a common area in a planer shape where an electrode plane of the top electrode 3 and an opposite electrode plane of the bottom electrode 4 overlap is designated as an opposite area.

The top electrode 3 has square holes 7 formed almost all over the area of the planer shape thereof, i.e., on the entire opposite area of the electrode plane, the minute holes having a depth equivalent to the thickness (hu) of the top electrode. In other words, the holes 7 are only formed on the top electrode 3. For ease of viewing, the holes 7 are represented in much larger size than the actual size in FIGS. 1 and 2.

In the opposite area of the electrode plane of the top electrode film facing the electrode plane of the bottom electrode film, the ratio of the dimension of an area covered with a metal film to the whole dimension S of the opposite area is defined as covering ratio σ (when 100% of the opposite area of the electrode plane is covered with a metal film, σ=1).

In the present invention, the top electrode 3 for which resonant frequency is fine-tuned has a holes structure including a plurality of holes 7 formed on the area facing the bottom electrode 4 i.e., the opposite area of the electrode plane and having a depth equivalent to the thickness of the top electrode 3, and has a resonant frequency at which an acoustic wave excited by the piezoelectric material 5 cannot identify the individual holes 7. Since an acoustic wave is a wave and has an extent equal to the wavelength, it cannot identify the individual hole of the holes structure substantially smaller than the wavelength. In the present invention, the same is true if "acoustic wave" is replaced with "electric field" excited by the top and bottom electrodes.

Here, a hole of size in which an acoustic wave or an electric field cannot identify the hole has a structure in which, for example, assuming that total thickness of the laminated top and bottom electrodes and a piezoelectric material is ht, the covering ratio σ at the opposite area of the electrode plane of the top electrode 3 satisfies a condition 0<σ<1 for every 1.28 ht pitch.

In other words, one of the characteristics of the present invention is that the covering ratio σ, in the opposite area of the electrode plane of the top electrode, is a ratio of the area Smc of the portion where no holes are formed to the whole area Sm0 of each mesh assumed for every 1.28 ht pitch, and that the top electrode for which resonant frequency is fine-tuned has the covering ratio σ which meets the condition 0<σ<1 for each mesh in the opposite area of the electrode plane.

The insulating substrate 2 is made of an insulating material such as glass, compound semiconductor, high-resistance silicon, and piezoelectric material. The insulating substrate 2 may be a semiconductor substrate covered with an insulating film typically of silicon dioxide, a semi-insulating substrate, or conductor substrate.

A concave portion 6 is formed at a part of the insulating substrate 2. The concave portion 6 is filled with vacuum or gas, and functions to elastically insulate the resonator portion from the insulating substrate 2. As described later, during the manufacture, the concave portion 6 is filled with a sacrificial layer formed of an easy-to-etch material such as silicon oxide, silicon nitrate, phosphoric glass, germanium, and tungsten. After flattening the surface of the sacrificial layer, the bottom electrode 4, piezoelectric thin film 5, and top electrode 3 are formed or patterned, and then the sacrificial layer is removed.

When an alternating current is applied between the top electrode 3 and the bottom electrode 4 of each thin film piezoelectric bulk acoustic wave resonator, an elastic wave is excited in the piezoelectric thin film 5. This elastic wave is confined between the upper surface of the top electrode 3 and the lower surface of the bottom electrode 4 (distance between the surfaces ht=hu+hp+hd). Since the upper surface of the top electrode 3 and the lower surface of the bottom electrode 4 are elastically free surfaces, only an elastic wave with wavelength λ=(hu+hp+hd)/2 resonates to function as a resonator. In this embodiment, even if the sum of the film thickness (=ht) of the resonator portion is the same, it is possible to tune a resonant frequency to a different value by changing the covering ratio σ of the top electrode 3. That is, fine-tuning of a resonant frequency is made possible by patterning the structure of the opposite area of the electrode plane of a first metal thin film to change the covering ratio σ.

The length L of one side of the hole 7 on the top electrode 3 is sufficiently smaller that the wavelength of a resonating elastic wave. Also, the pitch (distance between the center of adjacent holes) P of the hole 7 is substantially smaller the wavelength λ of a resonating elastic wave. Therefore, an acoustic wave cannot identify the holes 7 individually, thus causing a change in elastic characteristic equivalent to that caused by a decrease in the density of the top electrode. The equivalent density in this case is proportional to the covering ratio.

In the present invention, the configuration of the opposite area of the electrode plane of the top electrode 3 can be defined using the wavelength λ of an elastic wave excited by the piezoelectric thin film. That is, according to an embodiment of the present invention, the covering ratio σ of the opposite area of the top electrode for which fine-tuning of a resonant frequency is made satisfies the condition 0<σ<1 for pitch P of 0.64 λ. For example, if a resonant frequency f of the resonator is 2 GHz, then λ=3 λm and P=1.92 λm.

If the top electrode is manufactured, for example, by the light exposure method using a photomask and a resist, the covering ratio σ can be set arbitrarily by the photomask and the amount of exposure during the patterning of the top electrode.

Resonant frequency is a frequency obtained by dividing the acoustic velocity of a resonating elastic wave by the wavelength thereof. Acoustic velocity varies with the twelfth power of a value obtained by dividing the elastic constant of a material by equivalent density. As a result, in the first embodiment, the patterning process for the top electrode 3 enables the tuning of a resonant frequency.

FIG. 3 is a perspective view of a radio frequency filter for transmission by a cellular phone, showing schematically an example of fabricating on a single substrate a radio frequency filter employing a thin film bulk acoustic wave resonator of this embodiment.

Figure 10:
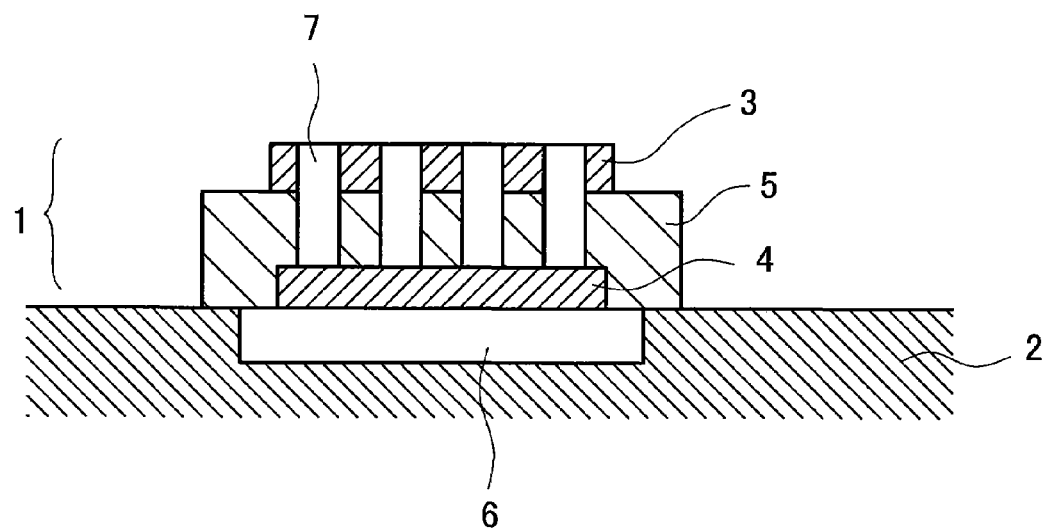
FIG. 10 is a longitudinal cross sectional view of a thin film piezoelectric bulk acoustic wave resonator to explain a second embodiment of the present invention.

A radio frequency filter 100 includes thin film piezoelectric bulk acoustic wave resonators 101 through 103 constituting a series resonator, and thin film piezoelectric bulk acoustic wave resonators 1 eleven through 114 constituting a parallel resonator. The top electrode 3 and bottom electrode 4 of each resonator has an extraction line 120 or an extraction line 121 respectively, through which the resonators 101 through 114 are connected as shown in FIG. 10. An input wiring pad 122 to which a transmission signal is sent is connected to the filter via an input pad 123 of the filter and a bonding wire 124. The input pad 123 is connected to the bottom electrode of a resonator 101 constituting the series resonator via an extraction line. The top electrode of the resonator 103 constituting the series resonator is connected to an output pad 125 via an extraction line. Furthermore, an output wiring pad 126 connected to an antenna is connected to the output pad 125 of the filter with a bonding wire 127. The top electrodes of the resonators 111 and 113 constituting the parallel resonator and the bottom electrodes of the resonators 112 and 114 are grounded respectively with bonding wires.

The thin film piezoelectric bulk acoustic wave resonators 101 through 103 and 111 through 114 constitute a single radio frequency filter that is a combination of resonators having no holes on the opposite area of the electrode plane of the top electrode 3 (covering ratio σ=1) and resonators whose resonant frequency has been tuned by changing the covering ratio σ of the electrode plane of the top electrode 3 under the condition described above. Presence or absence of the holes on each top electrode 3 and the pitch and shape of the holes are determined at the same time during the patterning process for the top electrode. Alternatively, the covering ratio σ may be changed under the abovementioned condition. That is, it is possible to form the radio frequency filter 100 having a plurality of thin film piezoelectric bulk acoustic wave resonators with different resonant frequencies without having to increase the number of steps during the fabrication process for the top electrode.

In FIG. 3, the piezoelectric thin film 150 is one piezoelectric thin film common to all the thin film piezoelectric bulk acoustic wave resonators. Needless to say, the piezoelectric thin film 5 may be provided independently for each thin film piezoelectric bulk acoustic wave resonator.

Although the top electrode 3 is formed of a single molybdenum film, a laminated structure composed of, for example, a molybdenum film and an Al film may be employed instead. Again, on the top electrode, minute holes 7 with a depth equivalent to the total thickness (hu) thereof are formed.

Figure 4:
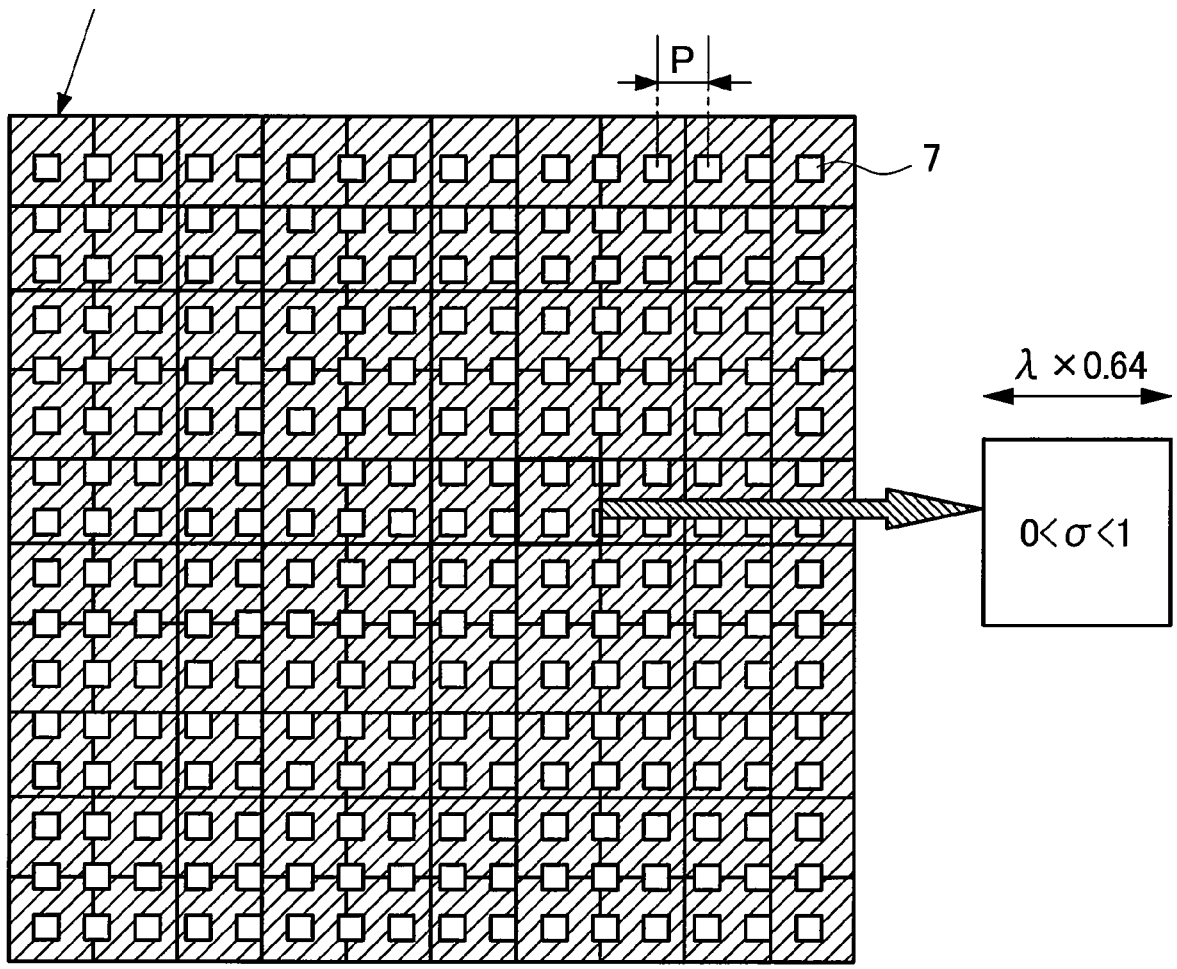
FIG. 4 a schematic diagram showing the opposite area of the electrode plane of a top electrode according to the first embodiment of the present invention.

FIG. 4 is a schematic diagram showing the opposite area of the top electrode 3 in the area facing the bottom electrode 4, in the first embodiment of the present invention. In order to illustrate the structure of the opposite area of the electrode plane of the top electrode 3, a mesh with a side of 0.64 times the wavelength (=hd+hp+hu×1.28) is shown. Since an acoustic wave and an electric field is a wave, any structure smaller than a mesh cannot be identified. And, any structure larger than a mesh (σ=0 or 1) is identified by an acoustic wave and an electric field. Accordingly, by setting the covering ratio within each mesh to be 0<σ<1, it is possible to produce an effect equivalent to that when the density of the top electrode film has increased σ-fold, without deterioration in capacitance.

FIGS. 5 through 9 illustrate the mechanism of the present invention.

Generally, in the FBAR, when a voltage is applied to the top and bottom electrode films an electric field is generated in the thickness direction at a portion sandwiched between the top and bottom electrodes (opposite areas in the electrode planes), and a piezoelectric thin film 5 expands or contracts in the thickness direction. In other words, an acoustic wave propagates in the thickness direction of the resonator portion 1 (a top electrode film 3 and a bottom electrode film 4 and the piezoelectric thin film 5 therebetween). Since the upper surface of the top electrode film 3 and the lower surface of the bottom electrode film 4 (face-to-face distance: ht=hd+hp+hu) are borders with vacuum (or a gas), the acoustic wave reflects off a free end there. In an acoustic wave that repeats reflection, frequency components thereof with different face-to-face distances hd+hp+hu and phases cancel each other. Eventually, only an acoustic wave in which the integer multiple of a half of the wavelength of the acoustic wave coincides with the face-to-face distance: ht=hd+hp+hu can exist (i.e., generates a resonance).

Figure 5:
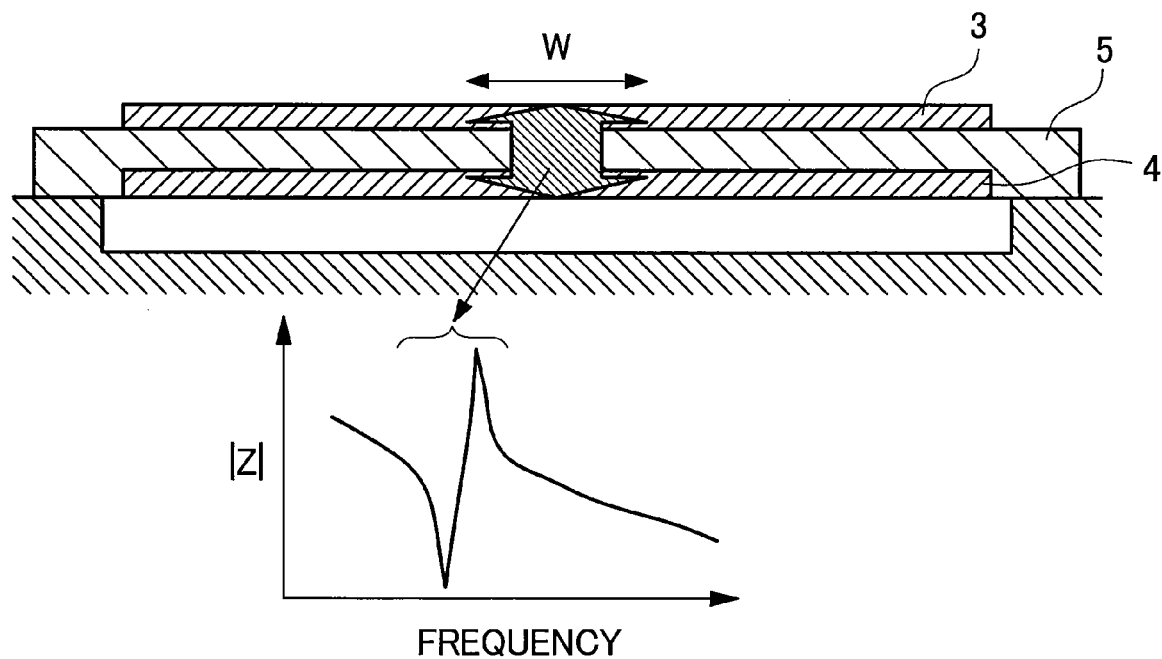
FIG. 5 is a schematic diagram showing the vicinity of the frequency of a fundamental harmonic of an FBAR having no holes on the top electrode.
Figure 6:
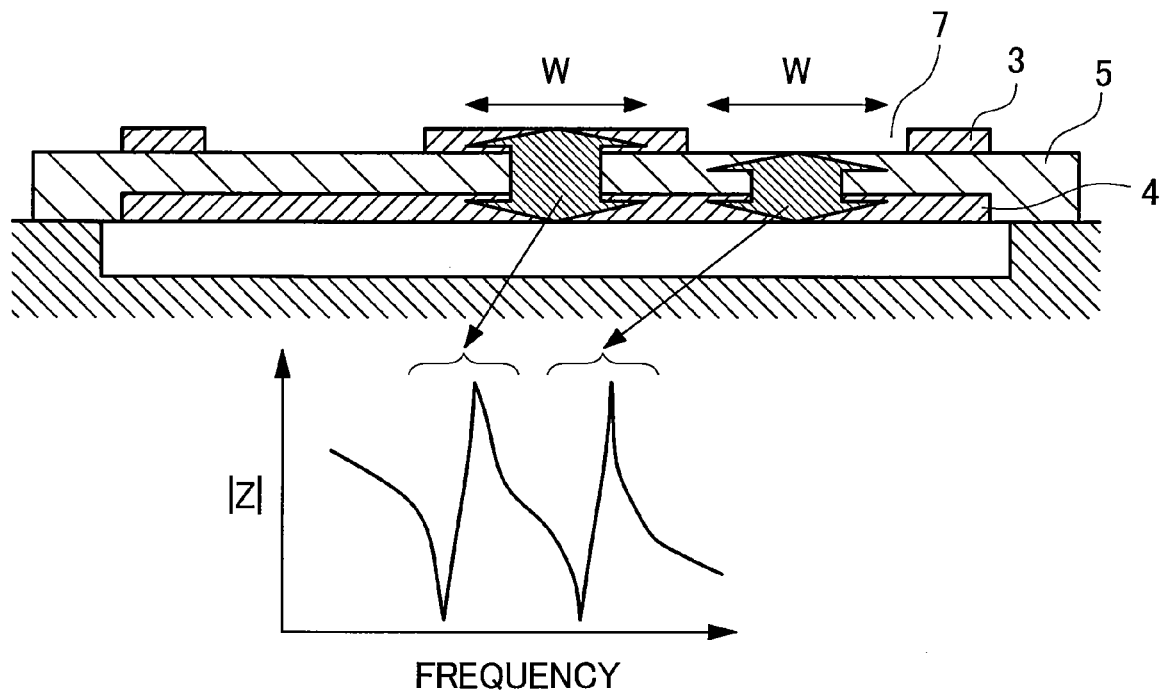
FIG. 6 is a schematic diagram showing the vicinity of the frequency of a fundamental harmonic of an FBAR having large holes on the top electrode.

FIGS. 5 and 6 show schematically the vicinity of a frequency that becomes a fundamental harmonic of that acoustic wave (a half of the wavelength=face-to-face distance: ht=hd+hp+hu). FIG. 5 is a schematic diagram showing the vicinity of the frequency of the fundamental harmonic for an FBAR having no holes on the top electrode. At a frequency with a half of the wavelength=face-to-face distance: ht=hd+hp+hu, impedance characteristic exhibits the resonance characteristic. Note that the W in these figures indicates the scope of the acoustic wave.

FIG. 6 is a schematic diagram showing the vicinity of the frequency of a fundamental harmonic of an FBAR having a hole 7 on the top electrode. As in FIG. 5, impedance characteristic exhibits a resonance characteristic (minimum and maximum (the resonance at the left side of the lower graph of FIG. 6)) at a frequency with a half of the wavelength=face-to-face distance: ht=hd+hp+hu. However, since a resonance occurs even at a portion where the hole 7 is formed, impedance characteristic exhibits a resonance characteristic (the resonance at the left side of the lower graph of FIG. 6) at a frequency with a half of the wavelength=face-to-face distance: hd+hp. In a ladder filter, if two resonance characteristics occur, one of them functions as a spurious wave and therefore it is necessary to limit the number of resonance to one.

Although it seems that an acoustic wave is not excited (i.e., no spurious wave occurs) since no electric field is generated at the piezoelectric thin film for a portion without the top electrode, it was confirmed through experiments by the inventors that an acoustic wave is excited, as described later. This is assumed to be due to the following two mechanisms.

(1) Since an electric field is a wave, it exudes around the top electrode even on a portion without the top electrode. The exuding amount is only a wavelength, but an acoustic wave is excited at that portion, thus resulting in a spurious wave.

(2) Although the direction of an electric field excited at the top and bottom electrodes exactly coincides with the thickness direction at the center of the electrode (i.e., the velocity direction of an acoustic wave exactly coincide with the thickness direction), the size of the electrode is limited and therefore the direction becomes oblique toward the end of the electrode. Hence, an acoustic wave excited becomes a ram wave containing a small amount of velocity component in the in-plane direction. A ram wave excited in an area where the top electrode is present reflects repeatedly off the upper and lower sides to gradually move in the in-plane direction, and also reflects repeatedly (i.e., resonates) off the upper and lower sides even in an area where the top electrode is not present. Then, the ram wave returns to the area where the top electrode exists and causes a spurious wave to occur.

Figure 7:
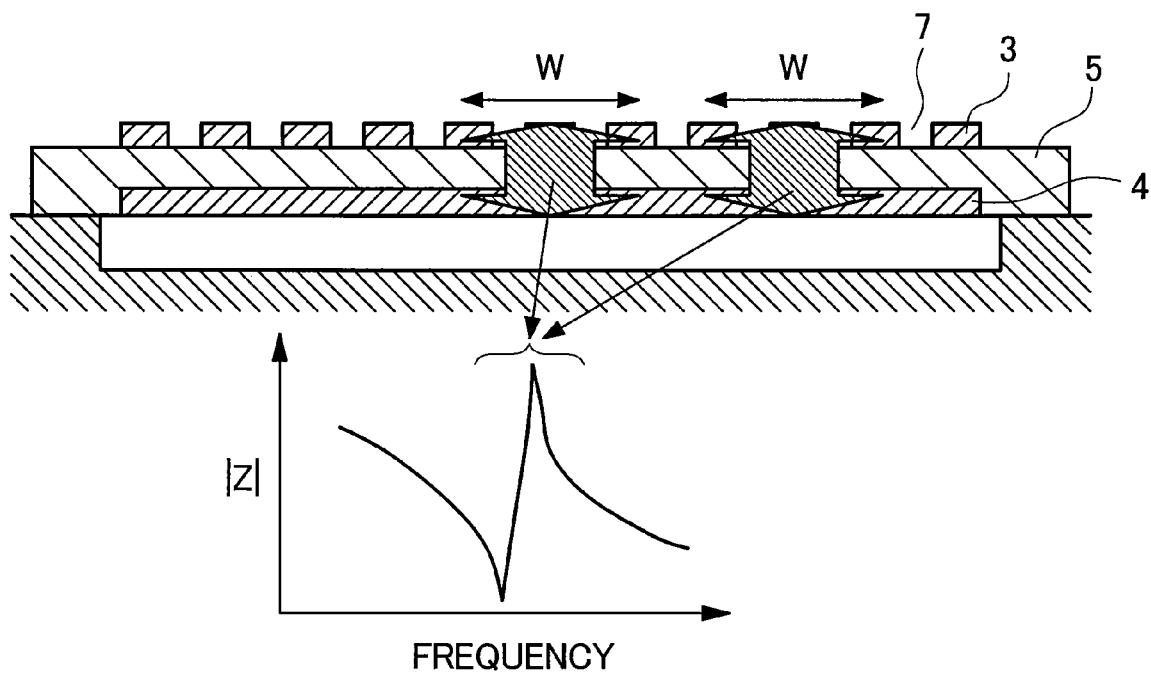
FIG. 7 is a schematic diagram showing the vicinity of the frequency of a fundamental harmonic of an FBAR having holes on the top electrode based on the concept of the present invention.

FIG. 7 is a schematic diagram showing the vicinity of a frequency of the fundamental harmonic of an FBAR having holes 7 on the top electrode. Unlike FIG. 6, the pitch P of the holes 7 is set to be shorter than the wavelength of an acoustic wave, based on the concept of the present invention. Since an acoustic wave is a wave and has an extent equal to the wavelength, it cannot identify a structure substantially smaller than the wavelength. Therefore, the FBAR shown in FIG. 7 cannot identify the holes on the top electrode individually and the impedance characteristic exhibits a resonance characteristic at a frequency with a half of the wavelength=face-to-face distance: hd+hp+hu. In other words, although the holes 7 are formed through the top electrode, a resonance characteristic does not occur at a frequency with a half of the wavelength=face-to-face distance: hd+hp, unlike the case in FIG. 6.

Figure 8:
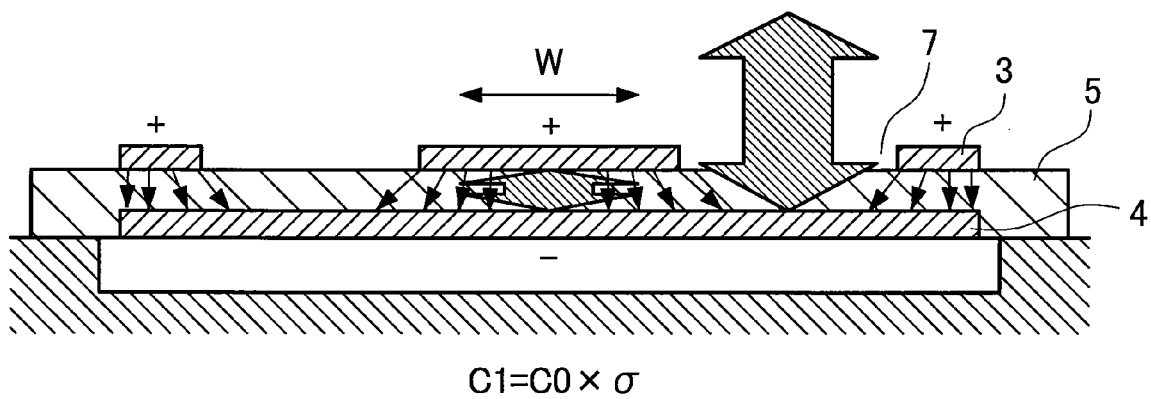
FIG. 8 is a schematic diagram showing a characteristic of capacitance in the FBAR having large holes on the top electrode.

FIG. 8 is a schematic diagram showing a capacitance characteristic in an FBAR having large holes 7 on the top electrode. If the hole is much larger than a half of the wavelength=face-to-face distance: hd+hp+hu, an electric field generated from the bottom electrode without the opposite top electrode emits outside, thus failing to contribute to capacitance. Assuming that the capacitance of an FBAR without holes is capacitance C0, capacitance C1 of an FBAR with holes becomes capacitance C0×covering ratio σ. As described in FIG. 6, besides the occurrence of spurious waves, deterioration in capacitance occurs.

Figure 9:
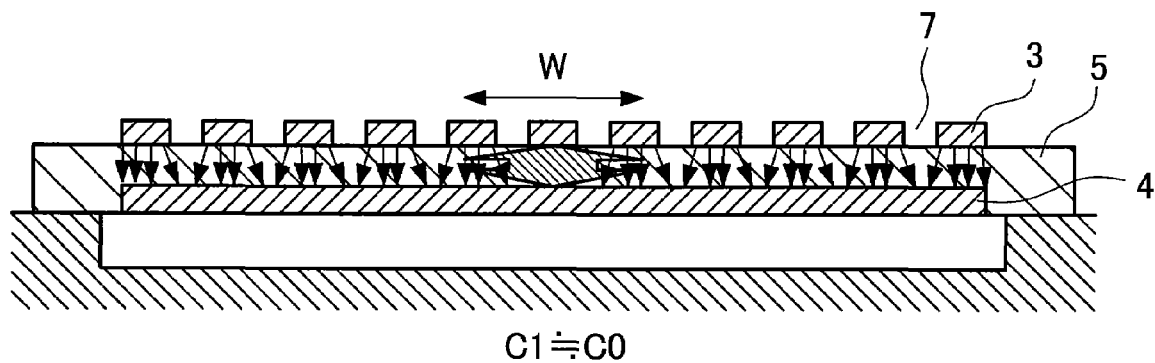
FIG. 9 is a schematic diagram showing a characteristic of capacitance in the FBAR having holes on the top electrode based on the concept of the present invention.

FIG. 9 is a schematic diagram showing a capacitance characteristic of an FBAR having holes 7 on the top electrode based on the concept of the present invention. Unlike FIG. 8, the pitch of the holes 7 is set to be shorter than the half wavelength of an acoustic wave. Since the electric field is a wave and has an extent equal to the wavelength, it cannot identify a structure substantially smaller than the wavelength. Hence, in the FBAR shown in FIG. 9, an electric field is unable to go out through the holes 7, thus causing no deterioration in capacitance (i.e., C1=C0). In other words, since an electric field has an extension equal to the wavelength and hence spreads at an end of the top electrode and thereby blocks the holes, the same electric characteristic as when no holes exist is exhibited.

Thus, if the pitch of the holes 7 formed through the top electrode is made substantially longer than the wavelength, the amount of capacitance decrease becomes small. This is because the pitch of the holes 7 is substantially shorter than the wavelength of an electric field and hence the electric field cannot identify the holes 7. Decreasing the covering ratio excessively increases the resistance of the top electrode and thereby decreases the effective capacitance. Therefore, making the covering ratio less than 0.1 should be avoided.

In the first embodiment, the holes on the opposite area of the electrode plane of the top electrode 3 have the same shape and equal pitches. That is, all the holes 7 are the same in shape and uniformly disposed over the opposite area. However, if the diameter of the hole is shorter than the wavelength of an acoustic wave, the acoustic wave cannot identify the shape of the hole. Accordingly, as long as the covering ratio σ satisfies the condition 0<σ<1 for every 0.64 λ pitch P, it is not always necessary to make the shape and pitch of the holes 7 the same all over the opposite area of the electrode plane. Even if the shape and/or pitch of the holes are not the same, as long as this condition is met the same effect can be obtained.

According to an embodiment of the present invention, it is possible to provide a thin film piezoelectric bulk acoustic wave resonator capable of fine-tuning the resonant frequency during the patterning process for the top electrode, without having to add a film on the top electrode. Also, since the resonant frequency difference can be controlled by the dimension in the in-plane direction of the top electrode 3, an expensive coating apparatus is not required, thus making it possible to provide a more inexpensive thin film piezoelectric bulk acoustic wave resonator.

In other words, it is possible to provide a thin film piezoelectric bulk acoustic wave resonator that does not use a loading layer and is composed of only a reflection layer, a bottom electrode, a piezoelectric thin film, and a top electrode, and also allows the realization of a plurality of thin film piezoelectric bulk acoustic wave resonators having different resonant frequencies in spite of the same film thickness for the bottom electrode, piezoelectric thin film, and top electrode.

That is, it is possible to provide a thin film piezoelectric bulk acoustic wave resonator allowing the forming of multiple thin film piezoelectric bulk acoustic wave resonators having desired resonant frequencies on the same substrate, without having to increase the number of fabrication steps.

Embodiment 2

Figure 11:
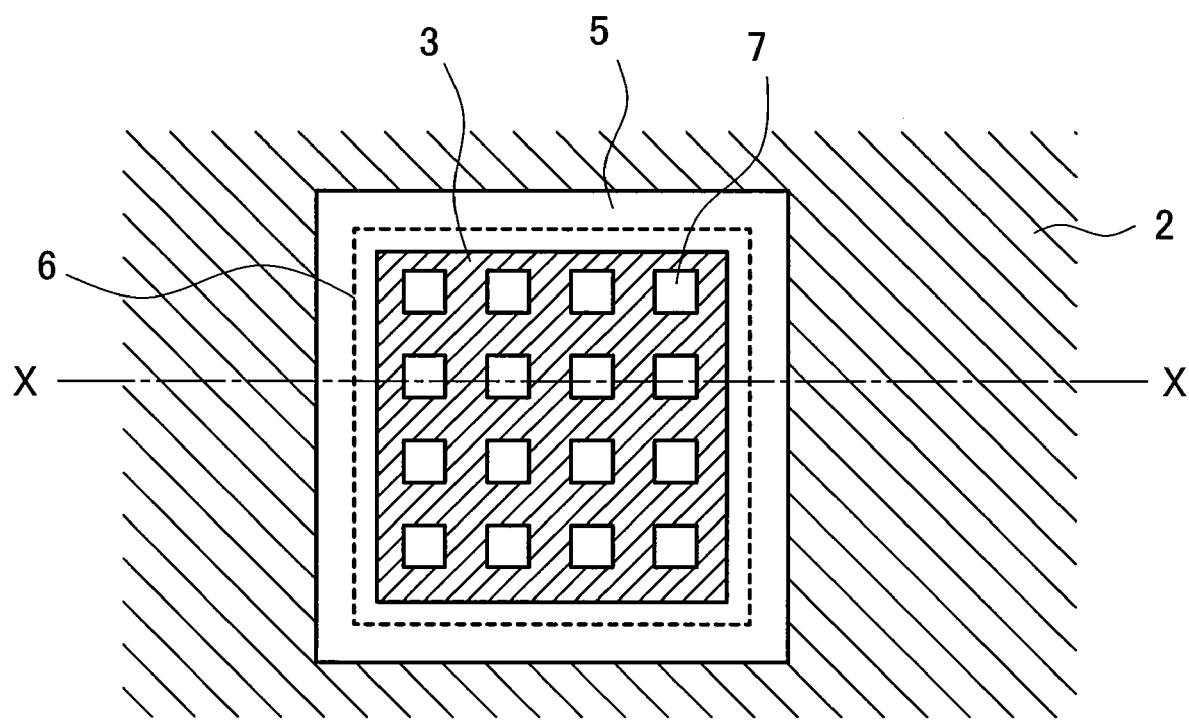
FIG. 11 is a schematic top view of a thin film piezoelectric bulk acoustic wave resonator to explain the second embodiment of the present invention.

FIGS. 10 and 11 show schematically a second embodiment. Although the top electrode 3 is the same as that of the first embodiment, unlike the first embodiment, the piezoelectric layer 5 has the same structure as that of the top electrode 3. That is, the holes 7 extend down to the bottom of the piezoelectric layer 5 through the top electrode 3, and have the depth equivalent to the combined thickness of the top electrode (film thickness: hu) 3 and the piezoelectric material (film thickness: hp) 5.

According to this embodiment, as in the first embodiment, resonant frequency can be tuned by controlling the covering ratio σ of the top electrode 3 and that of the piezoelectric material 5 (an area corresponding to the opposite area of the electrode plane of the top electrode 3 during the patterning process for top electrode 3 and the piezoelectric material 5.

Furthermore, since resonant frequency can be controlled by the dimension in the in-plane direction of the electrode plane of the top electrode 3 and the piezoelectric material 5, an expensive coating apparatus is not required and thus it is possible to provide a more inexpensive thin film piezoelectric bulk acoustic wave resonator.

Embodiment 3

Figure 12:
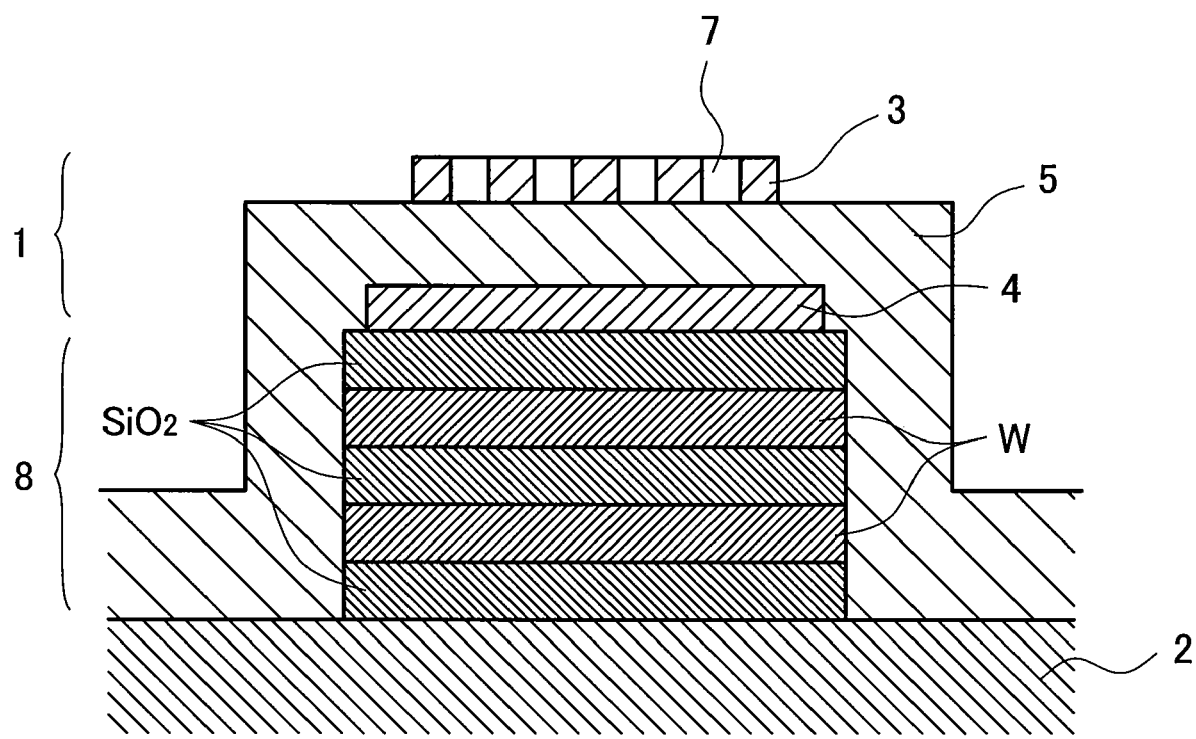
FIG. 12 is a longitudinal cross sectional view of a thin film piezoelectric bulk acoustic wave resonator to explain a third embodiment of the present invention.
Figure 13:
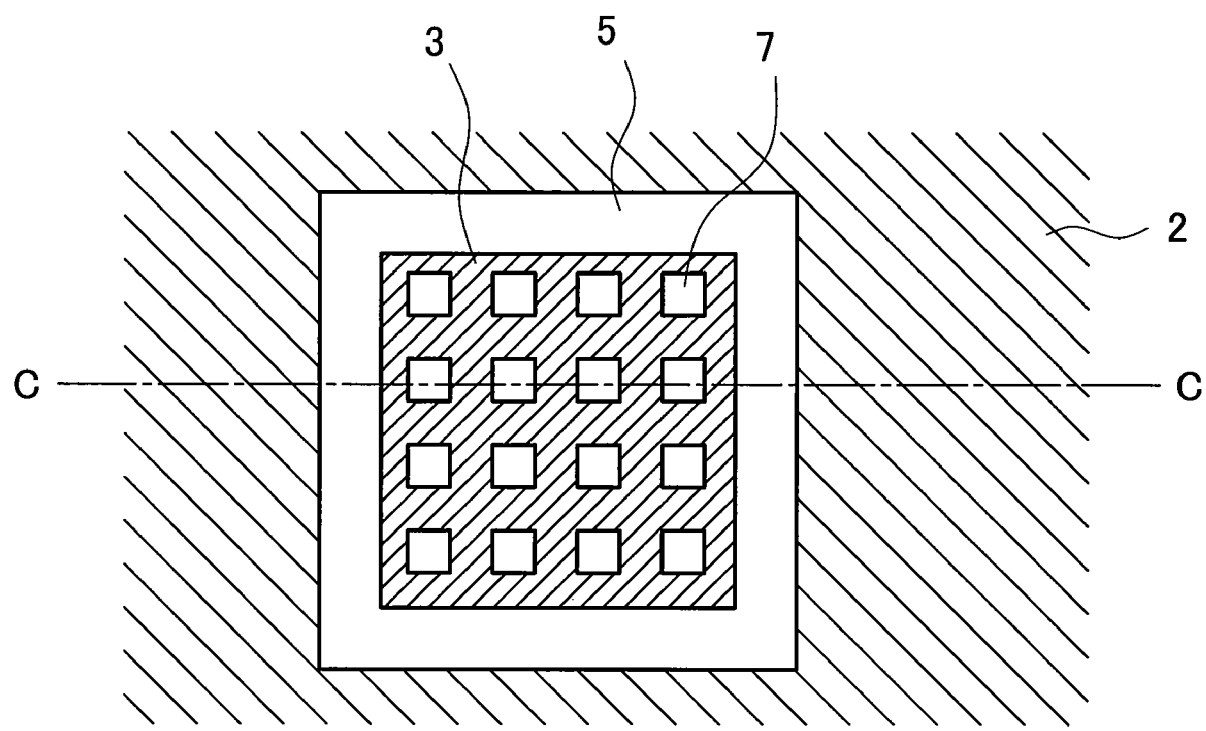
FIG. 13 is a schematic top view of a thin film piezoelectric bulk acoustic wave resonator to explain the third embodiment of the present invention.

A third embodiment of the present invention is described with reference to FIGS. 12 and 13. FIG. 12 is a schematic cross-sectional view of an SMR type thin film piezoelectric bulk acoustic wave resonator according to the third embodiment, showing the C-C cross section in FIG. 13. FIG. 13 is a schematic top view of the thin film piezoelectric bulk acoustic wave resonator of the third embodiment.

As an elastic wave reflector 8, two layers of tungsten film and three layers of oxide film are alternately deposited on an insulating substrate 3 (high-resistance silicon substrate) and each film is patterned. On the reflector, a square molybdenum film, an aluminum nitride film, and a square molybdenum film are deposited as a resonator portion 1 (bottom electrode 4, piezoelectric material 5, and top electrode 3).

The configuration of the resonator portion 1 is same as that of the first embodiment and has holes 7 on the top electrode 3.

According to this embodiment, as in the first embodiment, it is possible to tune resonant frequency by controlling the covering ratio of the top electrode 3 by the patterning process for the top electrode 3. Also, since resonant frequency difference can be controlled using the dimension in the in-plane direction of the top electrode 3, it is possible to provide a more inexpensive thin film piezoelectric bulk acoustic wave resonator without using an expensive coating apparatus.

Embodiment 4

Figure 14:
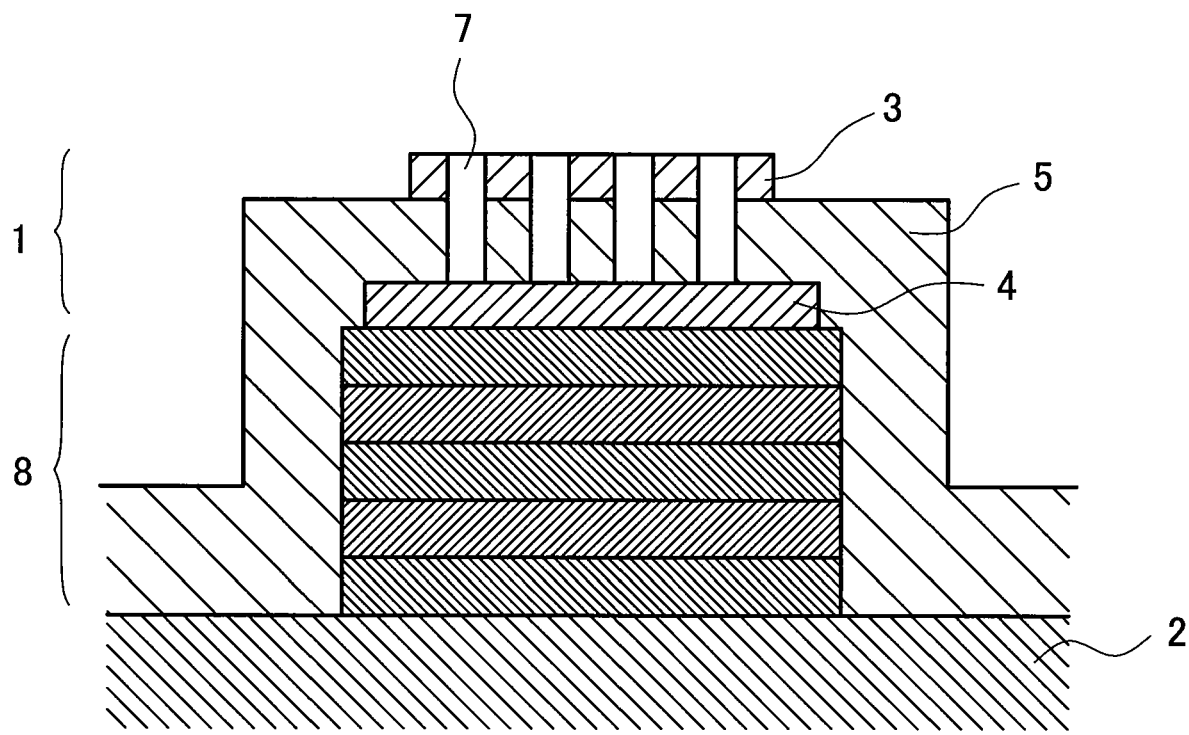
FIG. 14 is a longitudinal cross sectional view of a thin film piezoelectric bulk acoustic wave resonator to explain a fourth embodiment of the present invention.

FIG. 14 is a schematic diagram of an SMR type thin film piezoelectric bulk acoustic wave resonator according to a fourth embodiment. Unlike the third embodiment, the piezoelectric layer 5 has the same structure as that of the top electrode 3. According to the present invention, as in the second embodiment, it is possible to tune resonant frequency by controlling the covering ratio of the top electrode 3 and the piezoelectric layer 5 during the patterning process for the top electrode 3 and the piezoelectric layer 5.

Next, the inventors made a prototype of the SMR type thin film piezoelectric bulk acoustic wave resonator described in the third and fourth embodiments, in order to verify the operation and advantages of the present invention. That is, two layers of tungsten film (530 nm) and three layers of silicon oxide film (630 nm) were alternately deposited on an insulating substrate 2 (high-resistance silicon substrate) as an elastic wave reflector 8, and each film was patterned into a 128×128 μm square. On the reflector, a molybdenum film (hd=230 nm) and an aluminum nitride film (hp=1100 nm), each film being a 120×120 μm square, and a molybdenum film (hu=230 nm) of 100×100 μm square were deposited as a resonator portion (bottom electrode 4, piezoelectric material 5, and top electrode 3).

Holes 7 of each 1.2×1.2 μm square were formed all over the top electrode 3 at a pitch of 1.6 μm (covering ratio 0.438: device A=third embodiment). Also, a resonator whose piezoelectric material has the same minute structure as that of the top electrode 3 was fabricated (device B=fourth embodiment). Additionally, a resonator (covering ratio 1.00) without holes on the top electrode 3 and the piezoelectric material 5 was fabricated for comparison (device C=example for comparison).

Although only four holes 7 are shown in the schematic diagram, actually a total of 3,844 minute holes are formed all over the opposite area of the electrode plane of the top electrode. Here, the length of a side of the hole 7 was evaluated by observing the prototype with an optical microscope. Since the corners of the square hole were rounded, the length of a side of a square with the same area as the hole 7 was considered as that of the hole.

The film thickness of the resonate layer 1 was set so that resonant frequency becomes 1.9 GHz for a conventional style without holes 7. Also, the film thickness of the reflector layer was set at ¼ of the wavelength of a 1.9 GHz longitudinal bulk wave that propagates perpendicular to the film. Because of this, a longitudinal bulk wave near 1.9 GHz that excited in the resonate layer recognizes the lower surface of the bottom electrode 4 as a free reflection plane, and performs an operation equivalent to an FBAR as a resonator.

Although the electrical wiring is not shown in FIGS. 12 and 14, actually 60 μm wide extraction lines (230 μm thick molybdenum film and 500 nm thick aluminum film) are connected to the top electrode 3 and the top electrode 4, and the other end of the lines are connected to terminals for measurement. All the devices A, B, and C were formed on the same wafer.

Table 1 shows the measurement results of series resonant frequency and parallel resonant frequency for the devices A, B, and C.

TABLE 1

| | Covering ratio σ | Series resonant frequency [MHz] | Parallel resonant frequency [MHz] | Specific bandwidth | Capacitance [pF] |
|---|---|---|---|---|---|
| Device A | 0.438 | 1987.60 | 2028.55 | 0.0202 | 0.70 |
| Device B | 0.438 | 1928.00 | 1980.40 | 0.0265 | 0.65 |
| Device C | 1.000 | 1877.25 | 1916.60 | 0.0205 | 0.72 |

Compared with the device C, the resonant frequencies of the devices A and B has increased. The specific bandwidth is not deteriorated. By contrast, it is improved for the device B. This shows that it is possible to tune resonant frequency without deteriorating the specific bandwidth in each embodiment of the present invention.

Figure 15A:
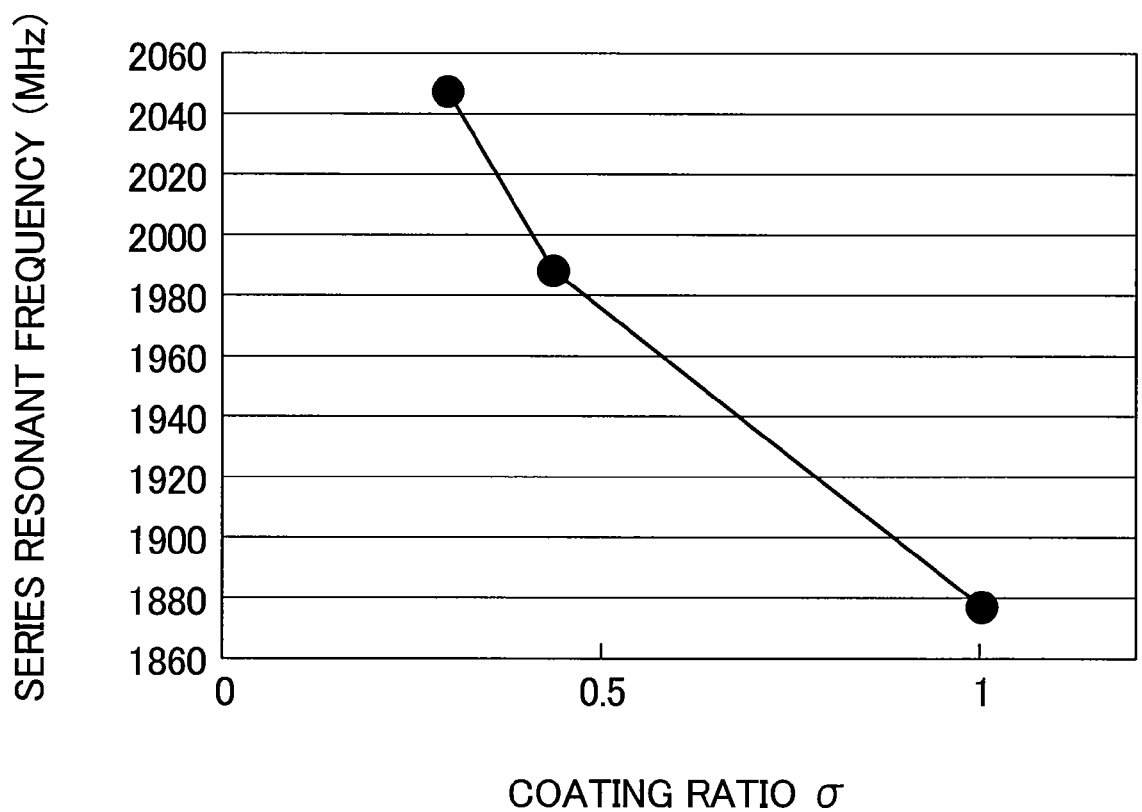
FIG. 15A shows the result of an experiment to determine the relationship between the series resonant frequency and covering ratio of a prototype device of the third embodiment of the present invention.
Figure 15B:
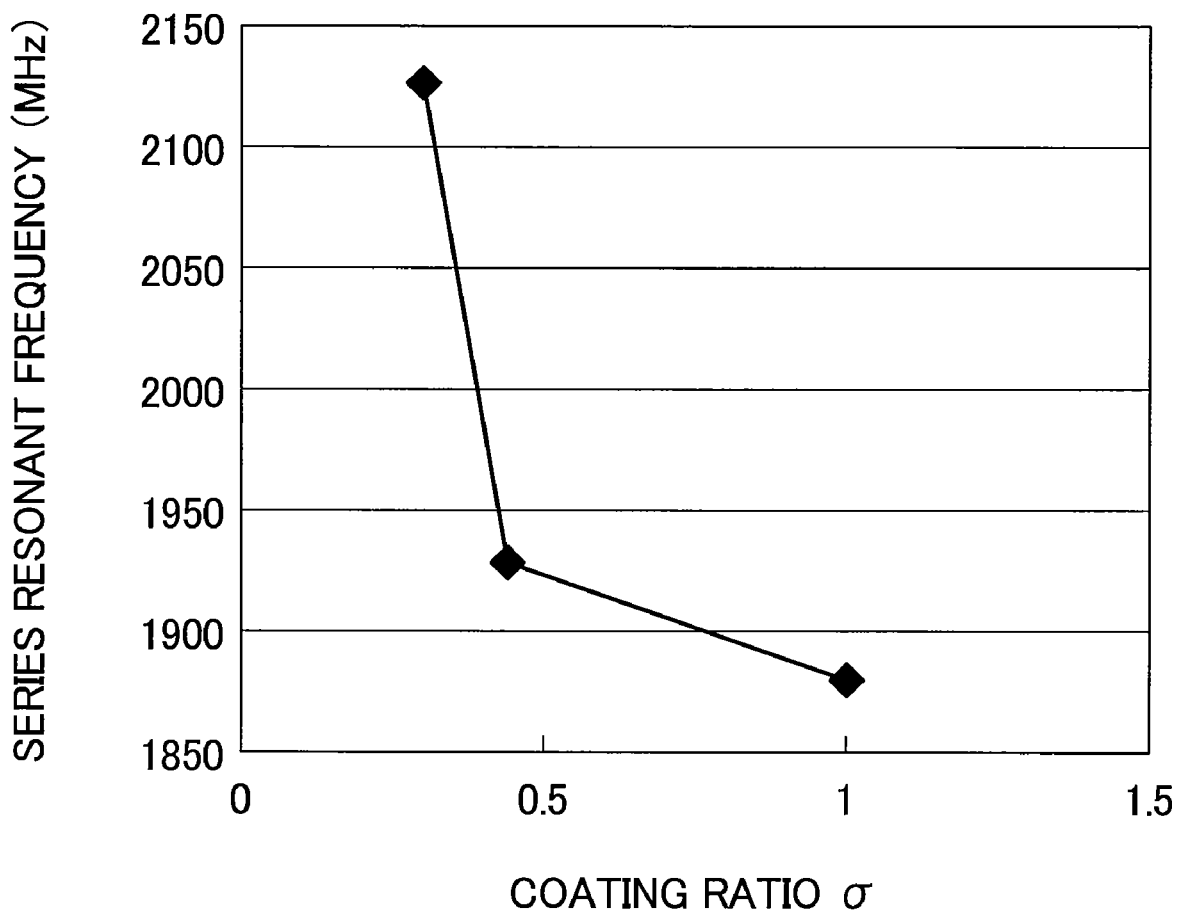
FIG. 15B shows the result of an experiment to determine the relationship between the series resonant frequency and covering ratio of a prototype device of the fourth embodiment of the present invention.

Next, a relationship between the covering ratio σ and series resonant frequency of the prototype is shown in FIGS. 15A and 15B.

FIG. 15A shows a relationship between the series resonant frequency and covering ratio of a prototype device of the third embodiment, and FIG. 15B shows a relationship between the series resonant frequency and covering ratio of a prototype device of the fourth embodiment.

As can be seen in FIGS. 15A and 15B, resonant frequency varies with the covering ratio of the top electrode, and it is obvious that series resonant frequency can be tunes by changing the covering ratio σ.

Figure 16A:
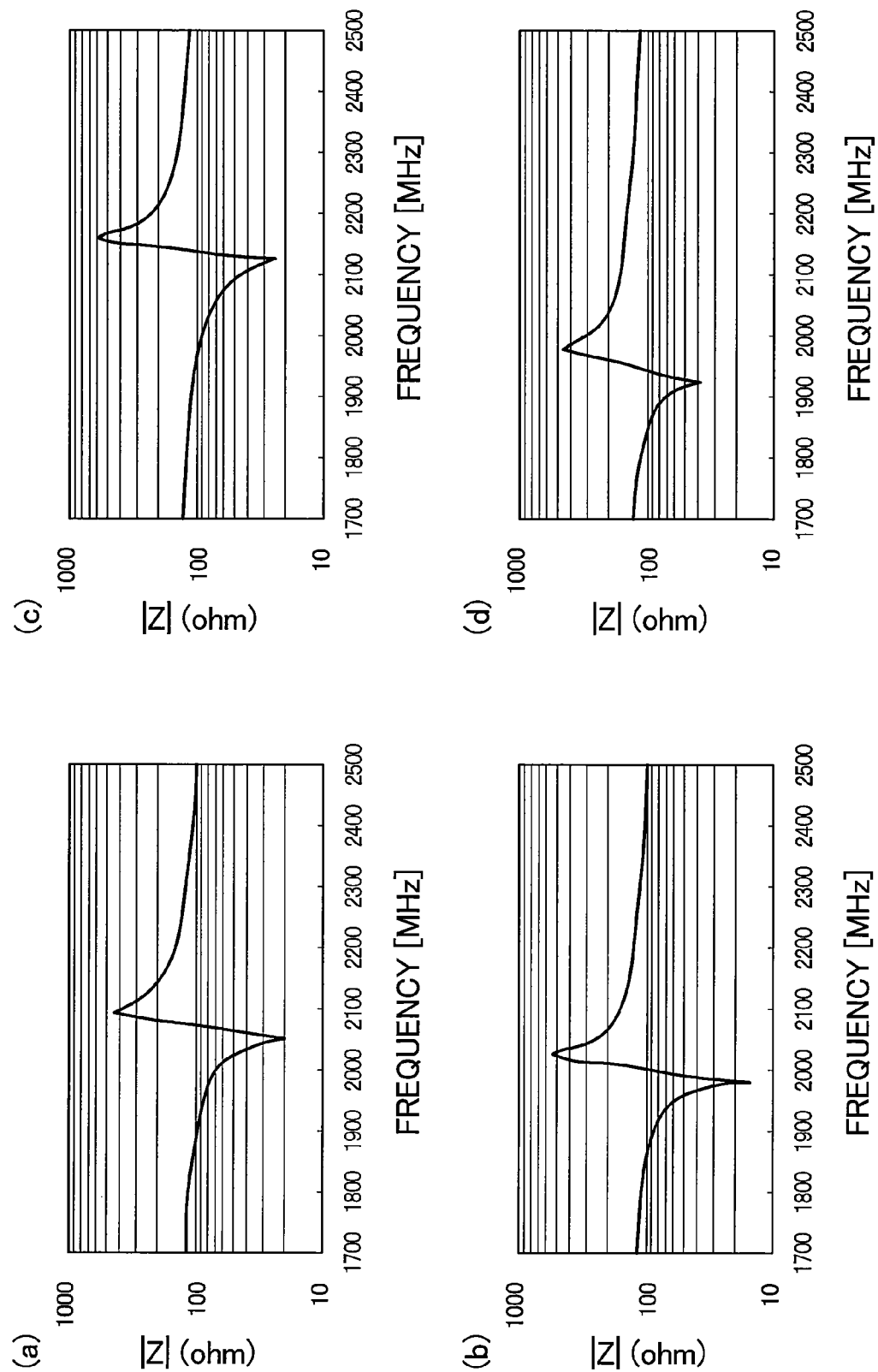
FIG. 16A shows the result of an experiment to determine the relationship between the covering ratio and the frequency characteristic of the impedance of the prototype device of the third and fourth embodiment of the present invention.
Figure 16B:
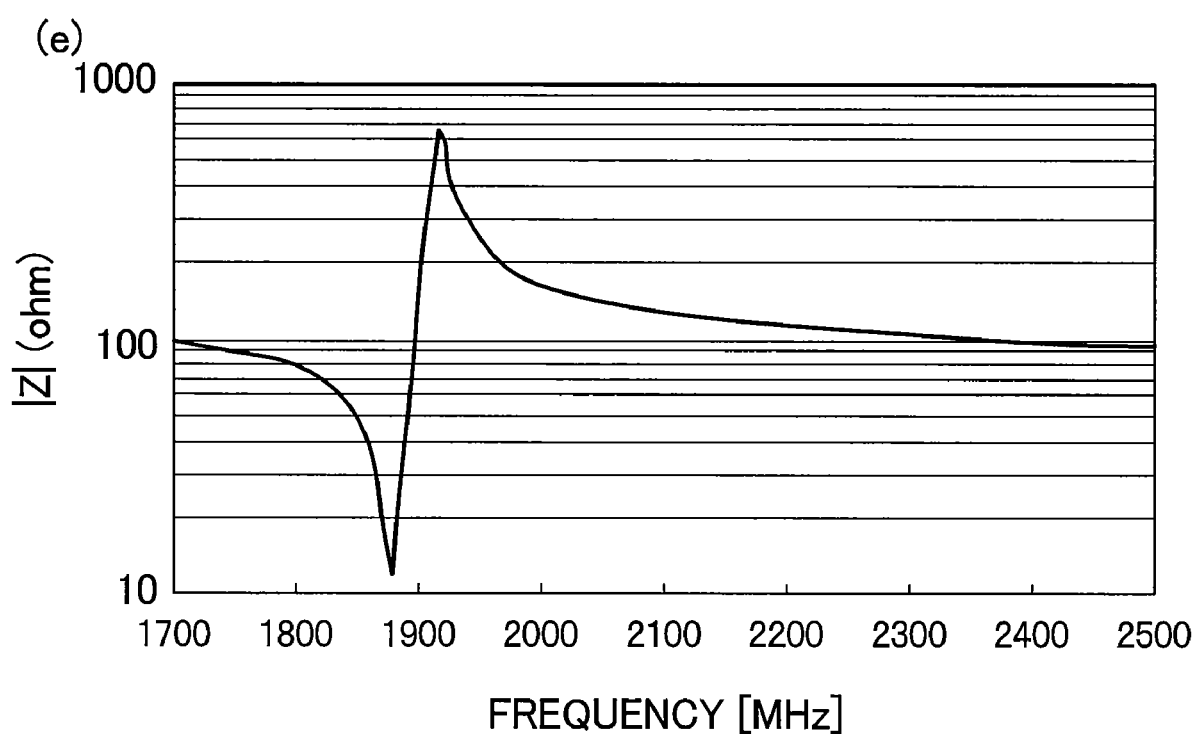
FIG. 16B shows the result of an experiment to determine the relationship between the covering ratio and the frequency characteristic of the impedance of the prototype device of the third and fourth embodiment of the present invention.

Furthermore, the frequency characteristic of the impedance of the device shown in FIGS. 15A and 15B is shown in FIGS. 16A and 16B.

The (a) of FIG. 16A shows a frequency characteristic of the impedance of a prototype device with covering ratio 0.306, and the (b) of FIG. 16A shows that of the a prototype device with covering ratio 0.438, both in the third embodiment. The (c) of FIG. 16A shows a frequency characteristic of the impedance of a prototype device with covering ratio 0.306 and the (d) of FIG. 16A shows that of a prototype device with covering ratio 0.438, both in the fourth embodiment. Also, the (e) of FIG. 16B shows a frequency characteristic of the impedance of a prototype device with covering ratio 1.000 as a comparative example.

The measured devices have covering ratio of 0.306 and 0.438 (devices A and B) and 1.000 (device C), all of which are devices fabricated on the same wafer. The covering ratio was tuned by the pattern of holes on a patterning photo mask for the top electrode.

From the (a) and (b) of FIG. 16A and the (e) of FIG. 16B, it can be seen that as covering ratio increases resonant frequency decreases. Also, form the (c) and (d) of FIG. 16A and the (e) of FIG. 16B, it is obvious that increasing the covering ratio decreases resonant frequency. This shows that using each embodiment of the present invention allows the provision of a thin film piezoelectric bulk acoustic wave resonator capable of fine-tuning the resonant frequency during the patterning process for the top electrode or the top electrode and the piezoelectric material. That is, since resonant frequency is determined by the size and/or pitch of the holes, it is possible to fine-tune the resonant frequency difference of each thin film piezoelectric bulk acoustic wave resonator precisely with mask dimensions. In other words, it is possible to provide a thin film piezoelectric bulk acoustic wave resonator that enables the forming of a plurality of thin film piezoelectric bulk acoustic wave resonators having different frequencies on the same substrate without having to increase the fabrication steps.

The resonators shown in FIG. 15, FIG. 16A, and FIG. 16B are resonators fabricated on the same wafer and hence can be electrically connected.

Conventionally, fabricating a resonator type ladder band pass filter required more steps than fabricating a resonator, thus increasing the cost. However, the present invention makes it possible to fabricate a resonator type ladder band pass filter with the same number of steps as for fabricating a resonator, resulting in lowered cost.

Figure 17A:
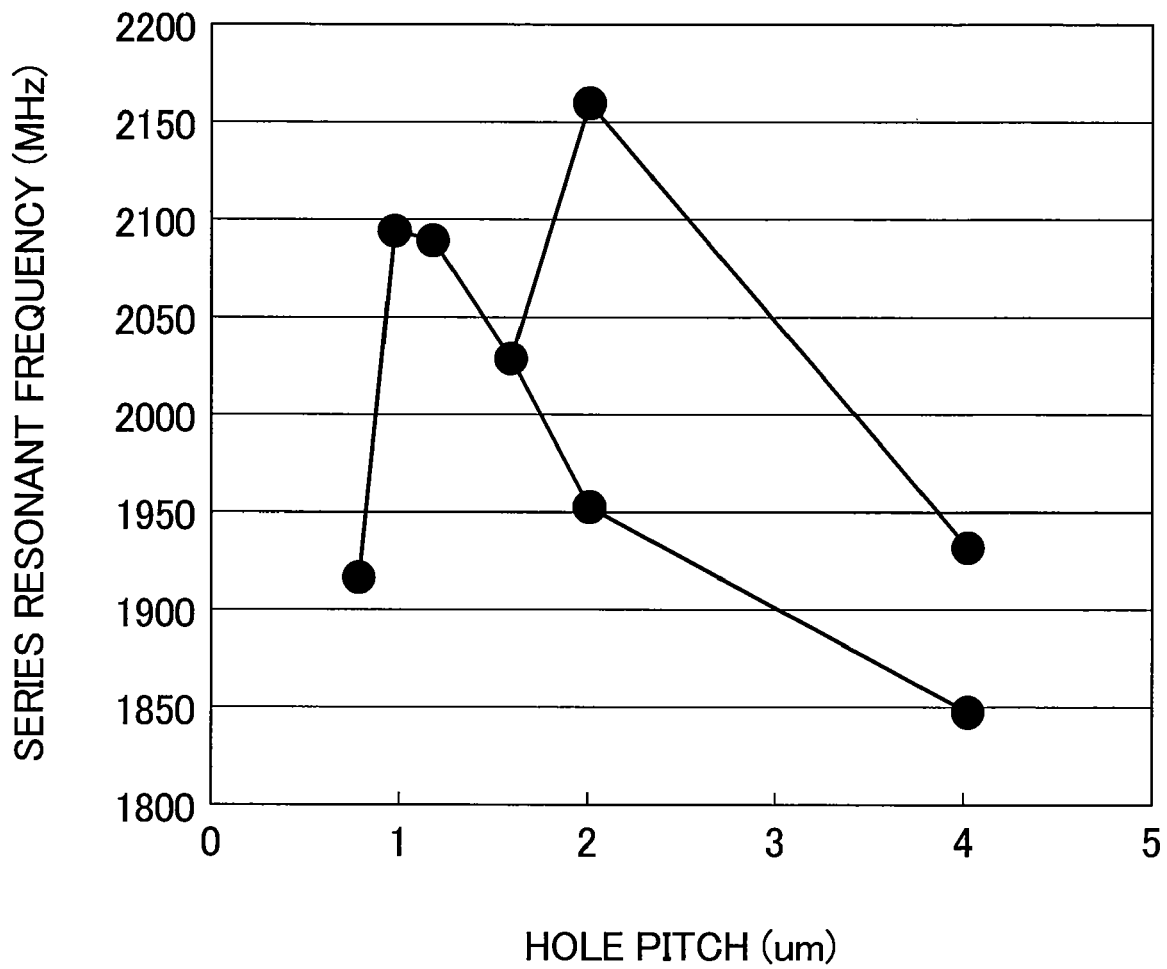
FIG. 17A shows the relationship between the series resonant frequency and the pitch of holes of the prototype device of the third embodiment of the present invention.
Figure 17B:
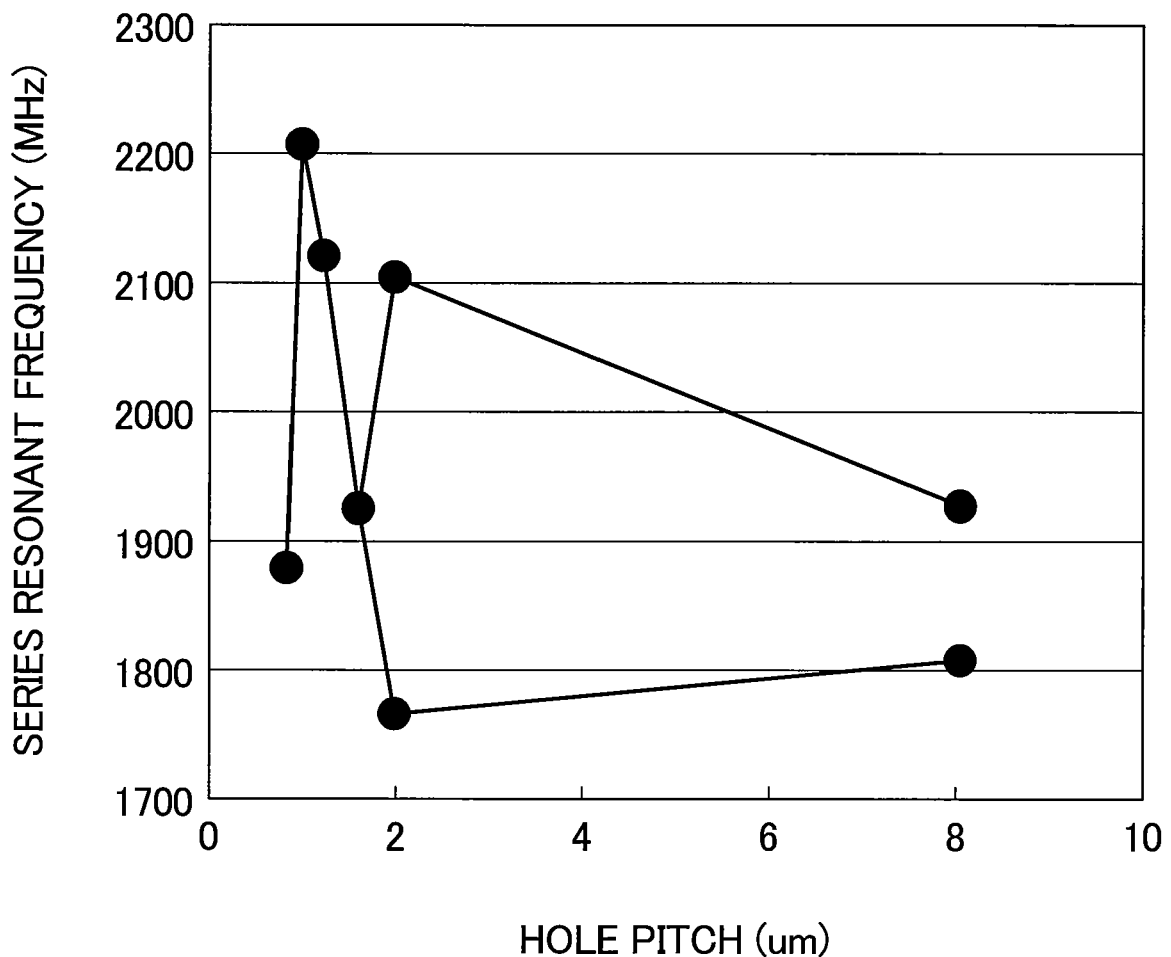
FIG. 17B shows the relationship between the series resonant frequency and the pitch of holes of the prototype device of the fourth embodiment of the present invention.
Figure 18:
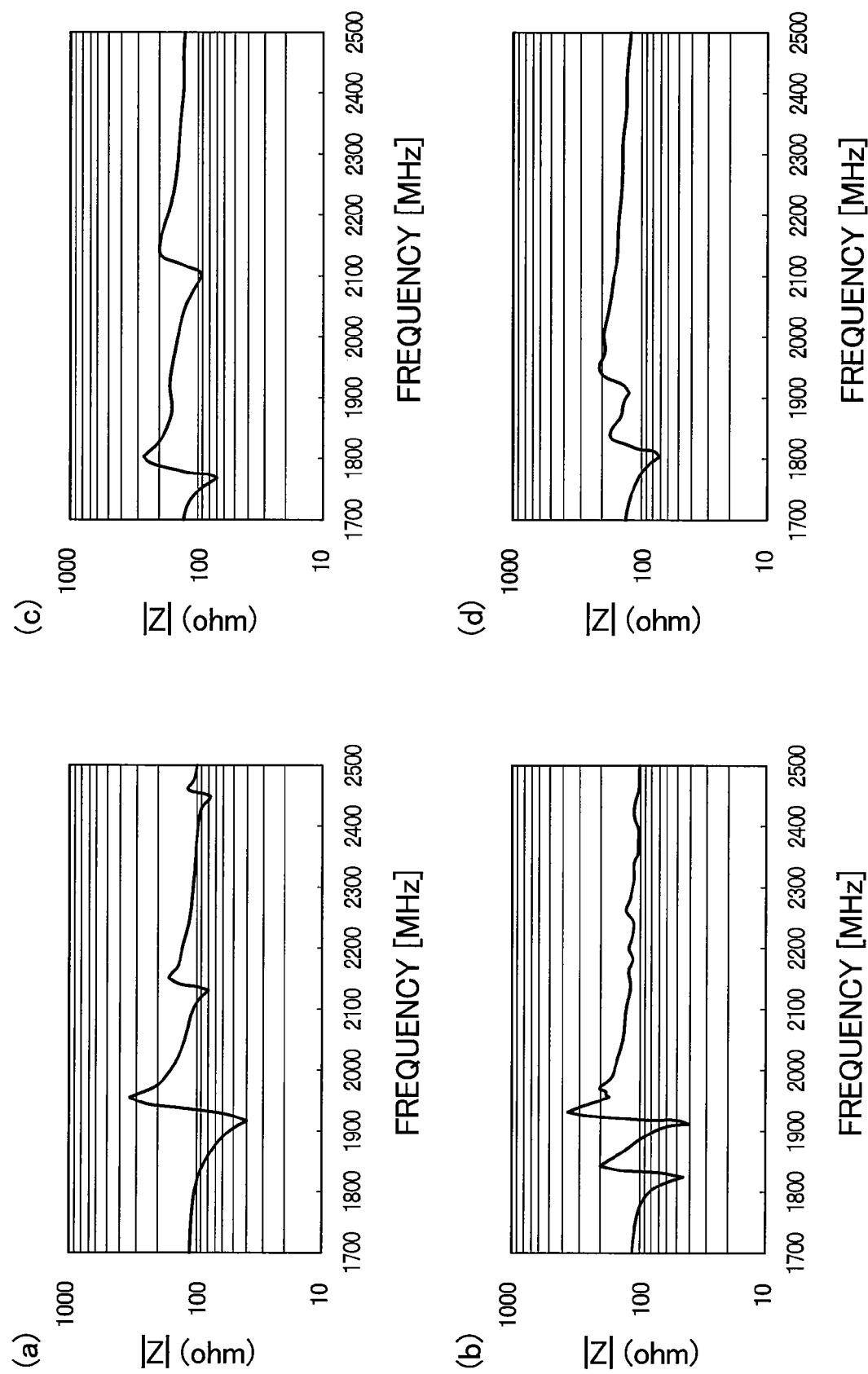
FIG. 18 shows the result of an experiment to determine the relationship between the pitch of holes and the frequency characteristic of the impedance of the prototype device of the third and fourth embodiments of the present invention.

FIGS. 17A, 17B and 18 are graphs showing the measurement results which is intended to clarify the extent to which the present invention is effective, in the third and fourth embodiments of the present invention.

FIG. 17A shows a relationship between the series resonant frequency and the pitch of holes of a prototype device in the third embodiment, and FIG. 17B shows a relationship between the series resonant frequency and the pitch of holes of a prototype device in the fourth embodiment.

As can be seen from FIGS. 17A and 17B, both of the prototype devices of the third and fourth embodiments shows that the resonant characteristic is one when the pitch of holes 7 on the resonator is 1.6 µm or less, and two when the pitch is 2.0 µm or more. This means that a 1.6 µm or less pitch of holes 7 satisfies a condition that the pitch be substantially shorter than the wavelength (2×(hd+hp+hu)=3.12 µm) of an acoustic wave, and hence the acoustic wave cannot distinguish an area with holes 7 from an area without holes 7, thus the resonant characteristic being one, while a 2.0 µm pitch of holes 7 does not satisfy the above condition and hence the acoustic wave distinguishes an area with holes 7 and an area without holes 7, resulting in two resonant characteristics.

The (a) of FIG. 18 shows a frequency characteristic of the impedance of a prototype device with the pitch of holes 2.0 µm, and the (b) of FIG. 18 shows that of a prototype device with the pitch of holes 4.0 µm, both in the third embodiment. A 2.0 µm or more pitch of holes 7 will not satisfy the above condition, and consequently a peak is split and two resonant characteristics occur.

The (c) of FIG. 18 shows a frequency characteristic of the impedance of a prototype device with the pitch of holes 1.0 µm, and the (d) of FIG. 18 shows that of a prototype with the pitch of holes 8.0 µm, both in the fourth embodiment. Again, a 2.0 µm or more pitch of holes 7 will not satisfy the above condition, thus resulting in two resonant characteristics.

From this experiment, it can be seen that it is necessary to make the pitch of holes 7 shorter than 2.0 µm for a wavelength λ=3.12 µm, that is the pitch of holes 7 must be shorter than 0.64 times the λ. Based on the result of the experiment, it was confirmed that this relationship holds true regardless of the size and depth of holes 7.

Although the experiment revealed that the present invention will not advantageous if the pitch of holes 7 is 2.0 µm or more, an excessively shorter pitch of holes 7 will make it difficult to fabricate the resonator, thus degrading the advantage of low cost of the present invention. For example, when fabricating the resonator using an I-beam photolithography machine, the pitch of holes 7 should be 0.1 µm or more so as to be easily fabricated by the phase shift method.

Figure 42:
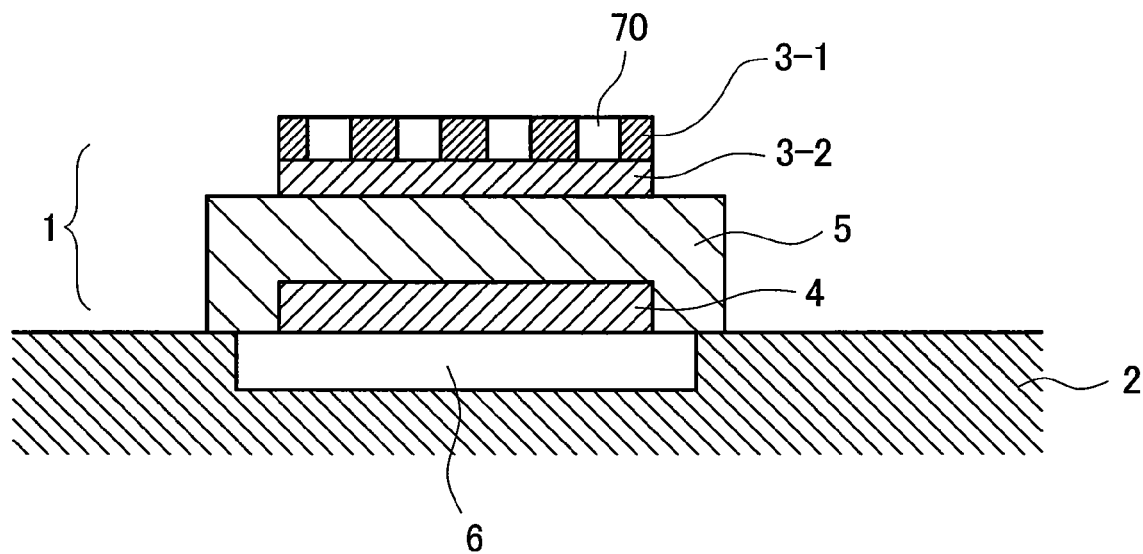
FIG. 42 is a schematic cross sectional view of a thin film piezoelectric bulk acoustic wave resonator of a comparative example.
Figure 43:
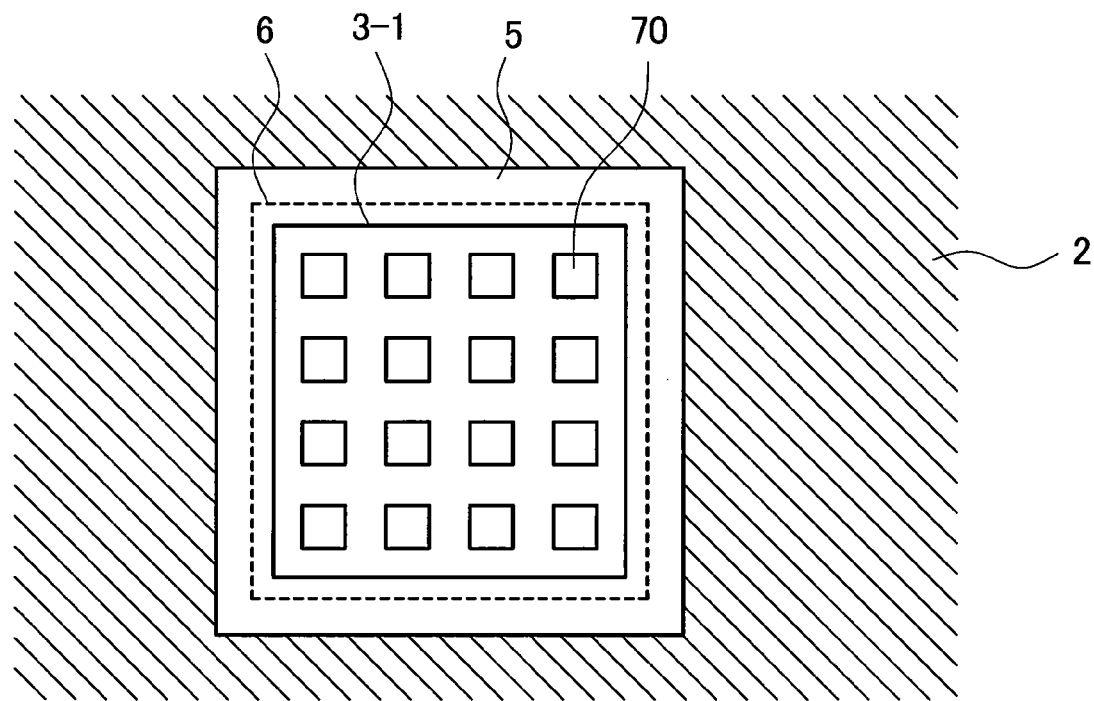
FIG. 43 is a schematic top view of FIG. 42.

FIGS. 42 and 43 are schematic diagrams showing an example to compare with the present invention. In the comparative example, unlike the embodiments of the present invention, the top electrode has a two-layer construction composed of an A layer 3-1 and a B layer 3-2. Holes 70 are formed only on the A layer 3-1 that are similar to the holes on the top electrode 3 of the first embodiment of the present invention, these holes do not reach the B layer 3-2. The B layer 3-2 is a metal thin film but the A layer needs not to be a metal thin film.

In the comparative example, as in the technique disclosed in U.S. Pat. No. 6,617,249B2, it is necessary to add the A layer 3-1 on top of the B layer 3-2 that is the original top electrode, and thus the number of fabrication steps remains the same as in U.S. Pat. No. 6,617,249B2. On the other hand, according to the present invention, it is possible to fine-tune resonant frequency by controlling the covering ratio of the B layer 3-2, which is the original top electrode, during the patterning process of the top electrode. Because of this, the comparative example will not realize a cost reduction, an advantage of the present invention.

Meanwhile, one of the important electric properties of a resonator is capacitance. Since capacitance C0 of a resonator is a capacitance between the top electrode and the bottom electrode, it is defined by:

$$C_0 = \varepsilon \frac{S}{h_p} \quad \text{(equation 2)}$$

where ε is the permittivity of the piezoelectric thin film and S is the size of the opposite areas of the electrode plane and the top electrode 3 and the bottom electrode 4. An optimum capacitance value of a resonator is determined by the use of the resonator. Since reducing the size of a resonator increases the number of resonators that can be fabricated from a single wafer, a resonator having larger capacitance per unit area can be fabricated at lower cost.

When a resonator of an embodiment of the present invention is compared with the resonator of the comparative example shown in FIGS. 42 and 43, the size of the opposite areas or the electrode planes of the top electrode 3 and the bottom electrode 4 is smaller by a value indicated by the covering ratio. It seems that the cost of the embodiment of the present invention seems higher due to this, but actually the cost of this embodiment is lower as described below.

First, the actual measurement values of the capacitance of the third and fourth embodiments of the present invention are shown in abovementioned Table 1. The covering ratio of the device A and device B is less than half, while the reduction rates thereof are 2.8% and 9.7% which are negligible. Also, the reduction rates of the devices with covering ratio 0.306 are 4.2% and 9.7%. This shows that, by increasing the covering ratio, for example, to 0.306 or more, the third and fourth embodiments of the present invention can achieve a reduction of fabrication steps than the comparative example in FIGS. 42 and 43, and are eventually effective in cost reduction, though a cost increase due to an increase in resonator size is almost negligibly small.

In the first and second embodiments of the present invention, the pitch of holes 7 is substantially shorter than the wavelength of an elastic wave. Within the piezoelectric thin film, the wavelength of an elastic wave coincides with an electric field associated with an elastic wave. That is, the reason why the amount of reduction in capacitance was negligibly small is that the pitch of holes 7 was substantially shorter than the wavelength of an electric field and hence the electric field was unable to recognize the holes 7. If the covering ratio is decreased excessively, effective capacitance decreases due to an increase in the resistance of the top electrode. This is another reason for avoiding excessive reduction of the covering ratio.

In the resonator 1 of each embodiment of the present invention, the shape of the holes 7 formed on the top electrode was square, but a rectangular, circular, elliptical, polygonal, or elongated curvy crack-like structure formed during the patterning process has a similar effect. Also, a projection added during the coating process serves the purpose. In the case of such a hole-like or projection-like structure (abbreviated to a minute structure), narrow side, diameter, minor axis, the average of diameters of circumscribed and inscribed circles, width or the like may be used in place of the length L of a side of a square. For example, it is possible to form a plurality of elongated slits extending in the same direction of and in parallel with the extraction line on the electrode plane of the top electrode.

Also, the pitch P of holes 7 may be replaced with the center distance between adjacent structures. If there are a plurality of adjacent holes 7 and the center distances are different, the center distance to a closest hole 7 corresponds to the pitch used in the present invention. If the holes 7 are rectangular, it is obvious that the distance between center lines corresponds to the pitch used in the present invention, and if the holes 7 is of any other complicated shape the pitch is defined according to a square or rectangular holes.

These minute holes 7 or similar structures are formed during the patterning process and do not include pores and cracks resulting from the coating process.

In the second and fourth embodiments, holes 7 are formed on the top electrode 3 and the piezoelectric thin film 5. In this case, however, even if covering ratio is changed, the effective densities of the top electrode 3 and piezoelectric thin film 5 change simultaneously, and a resonant frequency exhibits a complicated behavior. Also, if holes penetrating from the top electrode 3 through the bottom electrode 4 are formed, a similar effect occurs to some extent, but in such a case, even if covering ratio is changed the effective densities of all the top electrode 3, piezoelectric thin film 5, and bottom electrode 4 change simultaneously and a resonant frequency exhibits a further complicated behavior. The first and third embodiments are the best for achieving the fine-tuning of a resonant frequency and the second and fourth embodiments are the second best.

Embodiment 5

As a fifth embodiment, an example of applying the present invention to a bypass filter is described with reference to FIGS. 19A through 21B.

Of the embodiments described above, the embodiment wherein the same sized holes 7 are uniformly disposed at the same pitch all over the top electrode 3 facing the bottom electrode 4 through the piezoelectric thin film 5 is the most preferable for achieving the first object of the present invention. By uniformly disposing the holes, it is possible to equalize the covering ratios within a resonator and thereby prevent the existence of more than one resonant frequency and realize a steep frequency characteristic.

However, although a steep frequency characteristic is required to fabricate a filter using a resonator, but a gradual frequency characteristic is often required within a stopband.

The fifth embodiment of the present invention is an embodiment wherein the covering ratio σ of the top electrode is given a distribution in order to meet the above requirement.

Figure 19A:
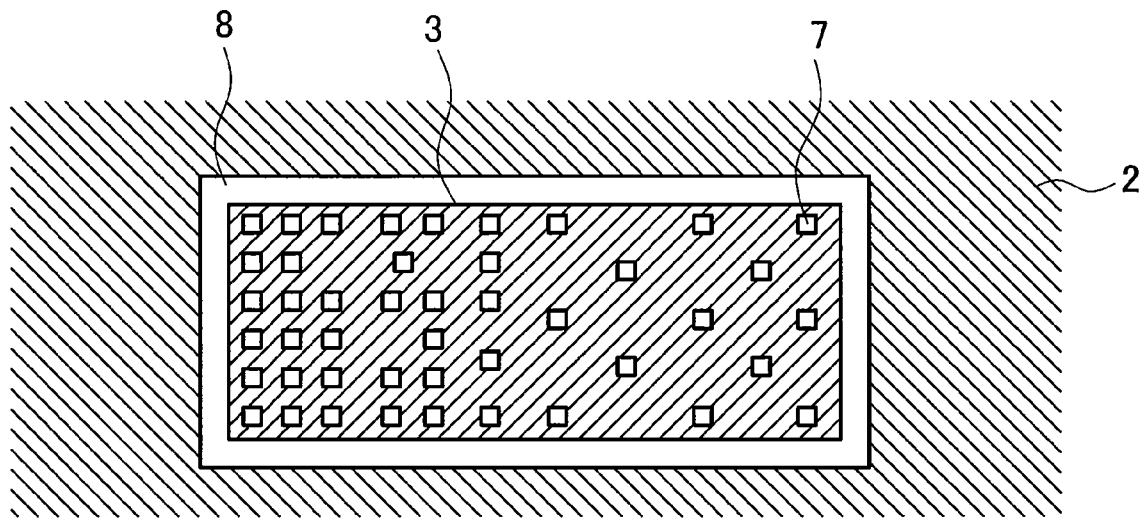
FIG. 19A is a schematic top view of the thin film piezoelectric bulk acoustic wave resonator to explain a fifth embodiment of the present invention.
Figure 19B:
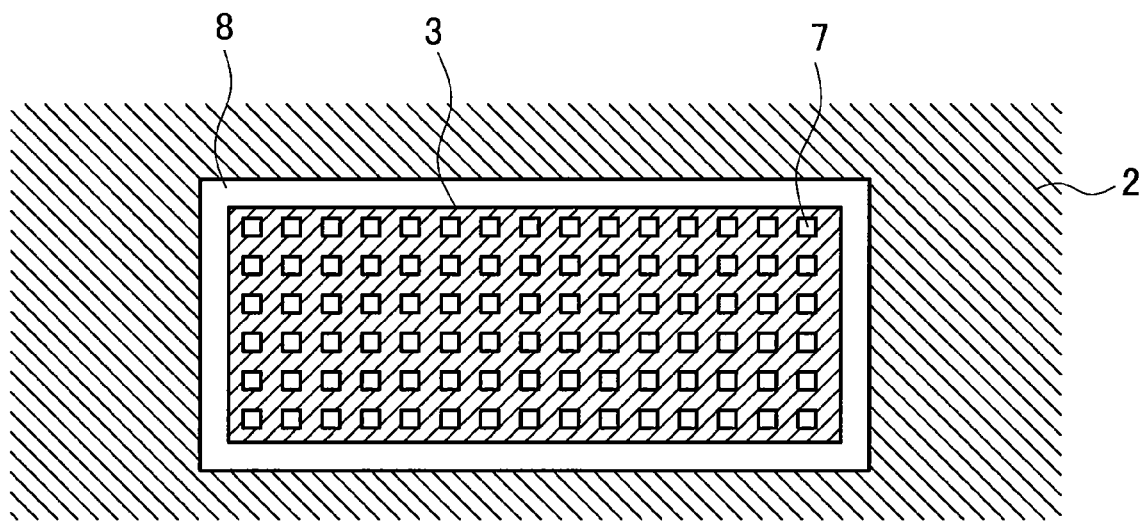
FIG. 19B is a schematic top view of the thin film piezoelectric bulk acoustic wave resonator equivalent to the first embodiment of the present invention for comparison.

A configuration of the fifth embodiment is described with reference to FIGS. 19A and 19B. FIG. 19A is a schematic top view the fifth embodiment to illustrate thereof, and FIG. 19B is a schematic top view of a resonator corresponding to the first embodiment which is shown for comparison.

The fifth embodiment has a shape similar to that of the first embodiment of the present invention, but the covering ratio σ gradually changes (decreases) from right to left. Hence, the resonant frequency also gradually changes.

Figure 20:
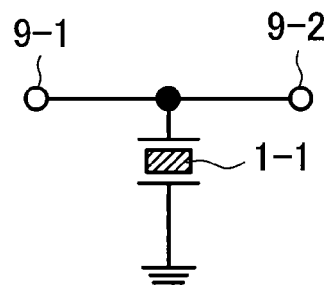
FIG. 20 shows the equivalent circuit of a highpass filter connected to the resonator of the fifth embodiment of the present invention.
Figure 21A:
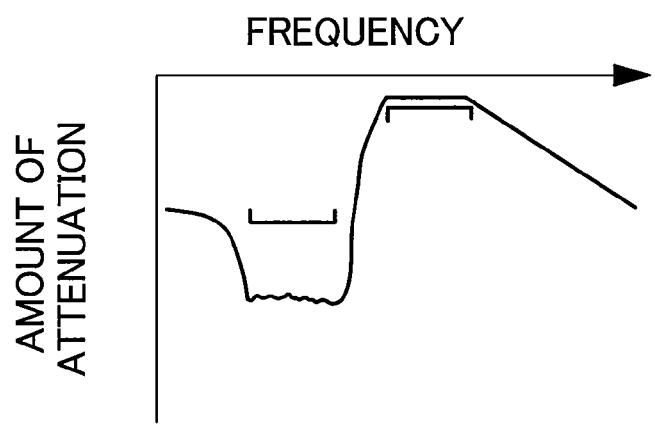
FIG. 21A shows a frequency characteristic of the highpass filter that is implemented in the equivalent circuit of FIG. 20 using the resonator of the fifth embodiment of the present invention.
Figure 21B:
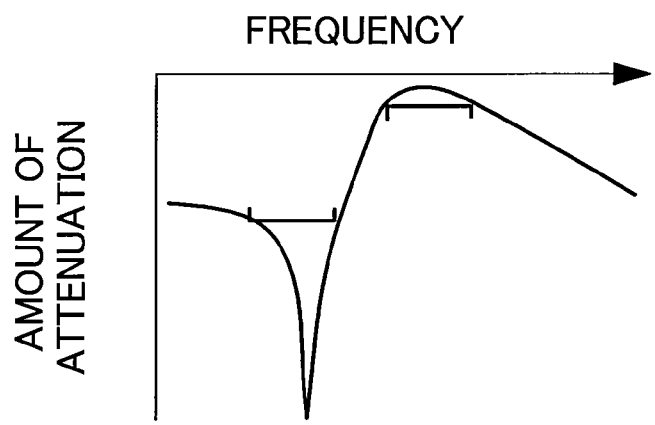
FIG. 21B shows the pass characteristic of a highpass filter using the resonator of FIG. 19B.

FIG. 20 shows an equivalent circuit of a highpass filter wherein the resonator of the fifth embodiment of the present invention is connected to a parallel arm, and FIG. 21A shows a pass characteristic in this case. Also, a pass characteristic of a highpass filter using the resonator in FIG. 19B is shown in FIG. 21B for comparison.

In the fifth embodiment of the present invention, since the covering ratio of the top electrode 3 gradually changes from left to right, resonant frequency also changes gradually. Therefore, compared with the first embodiment, the amount of peak attenuation in stopband has deteriorated but the broadening of stopband is realized, which has the effect of remarkably improving the minimum amount of attenuation within stopband.

According to an embodiment of the present invention, it is possible to provide a filter with a dramatically improved frequency characteristic that uses a thin film piezoelectric bulk acoustic wave resonator which allows the forming of thin film piezoelectric bulk acoustic wave resonators having different resonant frequencies on the same substrate, without having to increase the fabrication steps.

Embodiment 6

It is possible to bring an advantage other than cost reduction by forming the same structure as the top electrode of each embodiment described above on a temperature characteristics-improved film typified by a silicon dioxide film.

As a sixth embodiment of the present invention, an example of applying the present invention to a ladder filter is described with reference to FIG. 22.

In a ladder filter, it is necessary to minimize the temperature stability of the parallel resonant frequency of a series arm resonator 1-2 and the series resonant frequency of a parallel arm resonator 1-1.

However, the temperature coefficient of a resonator has a frequency characteristic, and hence it is impossible, with a temperature characteristic-improved flat film not having the same hole structure as the top electrode 3 of the first embodiment, to optimize the temperature stability of both the parallel resonant frequency of the series arm resonator 1-2 and the series resonant frequency of the parallel arm resonator 1-1 at the same time.

Figure 22:
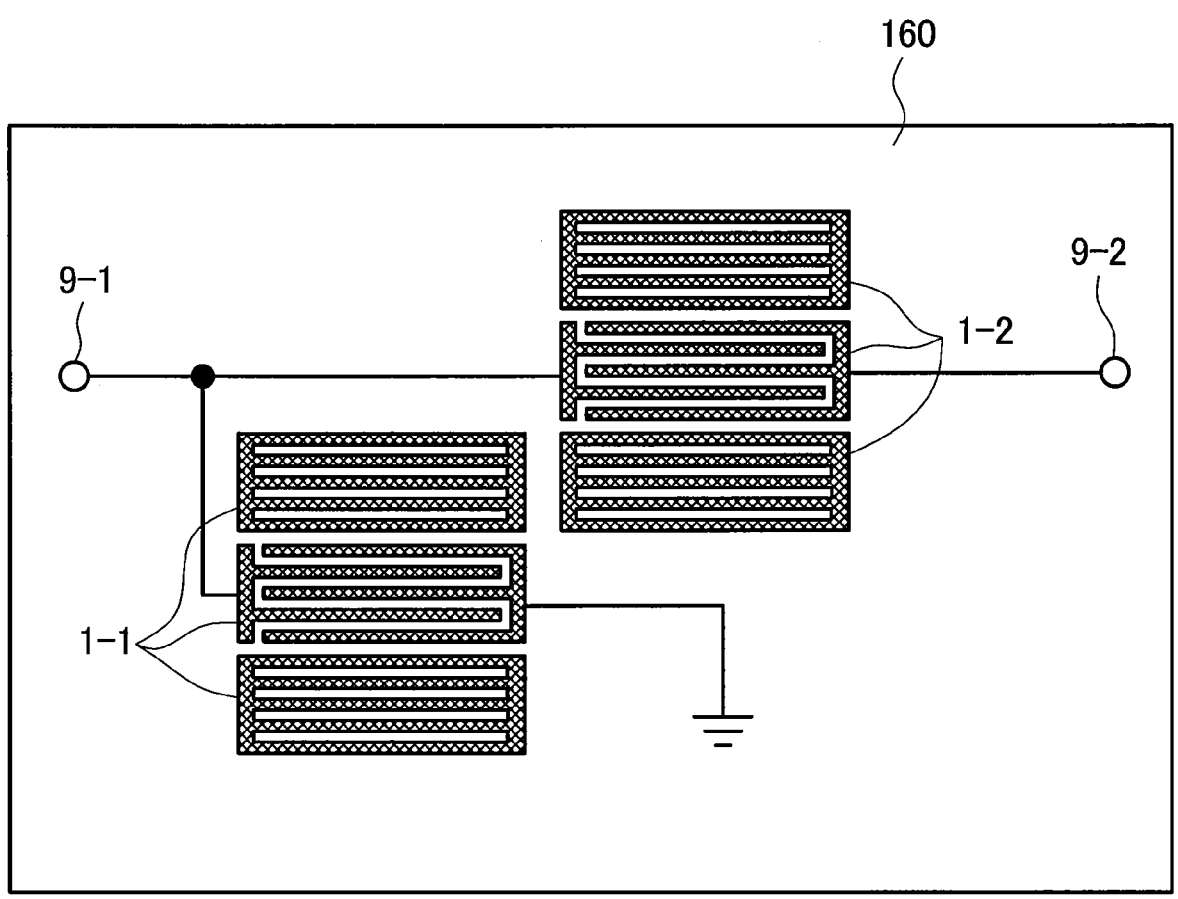
FIG. 22 is a diagram to explain an example of applying the present invention to a ladder filter as a sixth embodiment of the present invention.

In the sixth embodiment shown in FIG. 22, a temperature characteristic-improved having the same hole structure as the top electrode 3 of the first embodiment is added on top of a ladder filter 160 using a resonator capable of controlling the resonant frequency by the in-plane direction dimensions typified by each embodiment of the present invention described above. The series arm resonator 1-2 and a parallel arm resonator 1-1 constituting the ladder filter are formed on the same chip, and the film thickness of the temperature characteristic-improved film formed on the series arm resonator 1-1 and the parallel arm resonator 1-2 are the same.

By forming the same hole structure as the top electrode 3 of the abovementioned embodiment as a temperature characteristic-improved film, it is possible to set the series arm resonator 1-2 and the parallel arm resonator 1-1 to respective optimum covering ratios σ, and also to optimize the temperature stability of the parallel resonant frequency of the series arm resonator and the series resonant frequency of the parallel arm resonator at the same time. When designing a filter practically, if the respective temperature coefficients of the series and parallel resonators are optimized by the covering ratio of the temperature characteristic-improved film, the resonant frequencies deviate from the respective optimum values.

According to the sixth embodiment of the present invention, it is possible to tune the temperature coefficient by the covering ratio of the temperature characteristic-improved film and the resonant frequency by the covering ratio of the top electrode (in a SAW resonator, the pitch of comb-shaped electrodes), which makes it possible to optimize both the temperature characteristic and the resonant frequency at the same time.

In this embodiment, isolated patterns may be used in place of holes 7. A similar advantage can be obtained also in other embodiments of the present invention by forming the top electrode 3 with an aggregation of isolated patterns, but due to difficulty in wiring to the electrode this is a second-best embodiment.

Embodiment 7

A band pass filter according to a seventh embodiment of the present invention is described with reference to FIGS. 23 through 26.

Figure 23:
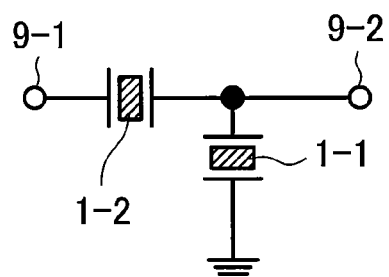
FIG. 23 is an equivalent circuit diagram of a filter to explain a seventh embodiment of the present invention.

FIG. 23 shows an equivalent circuit of the seventh embodiment of the present invention. This embodiment is a band pass filter including two resonators connected to each other. Specifically, the band pass filter is composed of one series arm resonator 1-2 connected between input-output terminals 9-1 and 9-2 and one parallel arm resonator 1-1 connected to earth.

Figure 24:
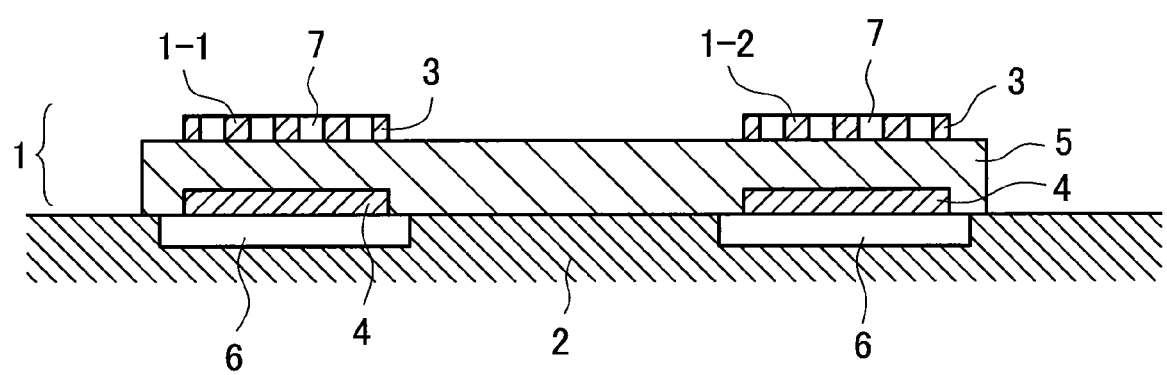
FIG. 24 is a longitudinal cross sectional view of a filter to explain the seventh embodiment of the present invention.
Figure 25:
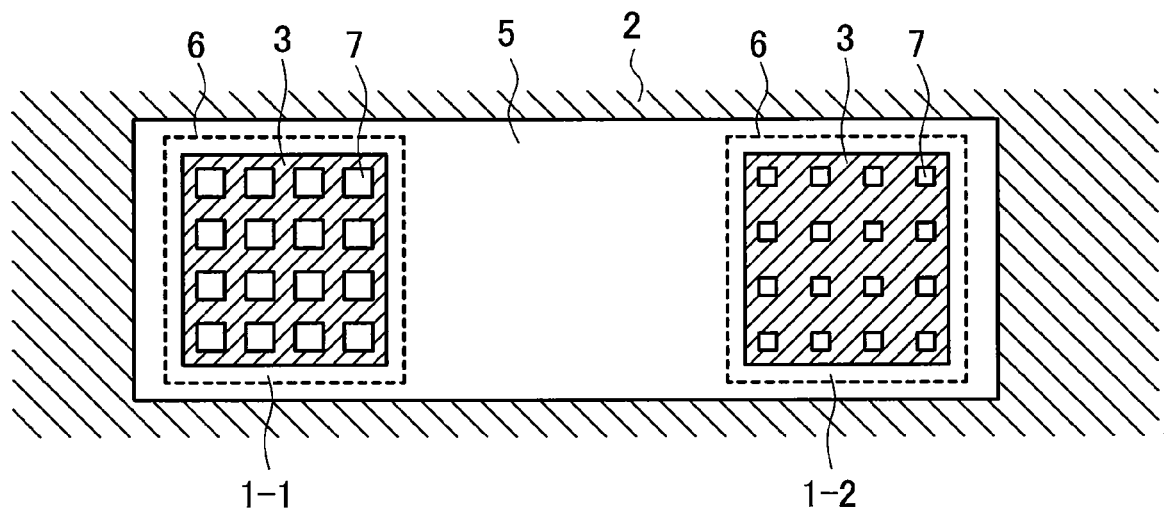
FIG. 25 is a schematic top view of a filter to explain the seventh embodiment of the present invention.

FIGS. 24 and 25 show the seventh embodiment of the present invention schematically. Two thin film piezoelectric bulk acoustic wave resonators 1 of the first embodiment are formed, one functioning as the series arm resonator 1-2 and the other as the parallel arm resonator 1-1. Although the electrical wiring is not shown in these figures, one electrode of the parallel arm resonator 1-1 is connected to one electrode of the series arm resonator 1-2 and the other electrode of the parallel arm resonator 1-1 is connected to earth. Both electrodes of the series arm resonator 1-2 are connected to the input-output terminals 9-1 and 9-2 respectively. They are shown in the equivalent circuit in FIG. 23.

Figure 26:
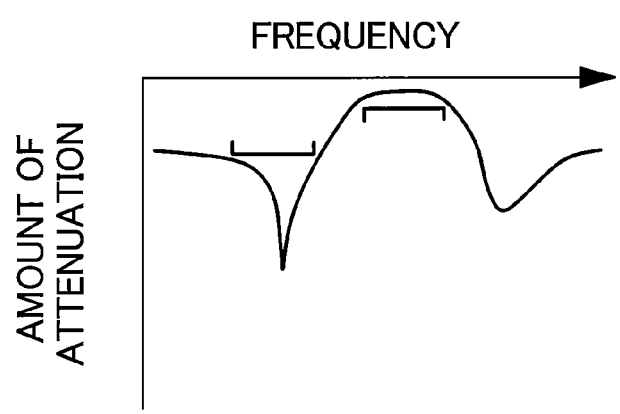
FIG. 26 is a frequency characteristic diagram of a band pass filter to explain the seventh embodiment of the present invention.

FIG. 26 shows a frequency characteristic of the seventh embodiment. Since a frequency whose attenuation amount sharply decreases from the series resonant frequency to parallel resonant frequency of the series arm resonator 1-2 is matched to a frequency at the edge of radio-frequency side of the pass band, and a frequency whose attenuation amount sharply decreases from the series resonant frequency to parallel resonant frequency of the parallel arm resonator 1-1 is matched to a frequency at the edge of low-frequency side of the pass band, this embodiment functions as a band pass filter.

Since the pass band of a band pass filter is determined by the frequency difference between the series arm resonator 1-2 and the parallel arm resonator 1-1, it is necessary to control the pass band with extremely high precision. In this embodiment, the covering ratio σ of the series arm resonator 1-2 is set higher than that of the parallel arm resonator 1-1. The difference in covering ratio cy can be controlled by the covering ratio of the pattern on the photomask and the difference in covering ratio on the photomask can be produced with almost zero error, and consequently the bandwidth of the band pass filter of the seventh embodiment of the present invention can be set precisely enough to be able to almost completely ignore the variation between wafers or within a wafer during fabrication. Hence, the guaranteed filter characteristics taking into account the process variation improves dramatically. Also, since the number of layers of film is one layer less than the resonator disclosed in U.S. Pat. No. 6,617,249B2, it is possible to fabricate the resonator with fewer steps and at lower cost.

From the foregoing, in the band pass filter using the first embodiment or the like of the present invention, it is possible to provide an inexpensive filter with dramatically improved frequency characteristics by increasing the covering ratio of the parallel arm resonator 1-1 than that of the series arm resonator 1-2.

Embodiment 8

A high pass filter according to an eighth embodiment of the present invention is described with reference to FIGS. 27 and 28B.

Figure 27:
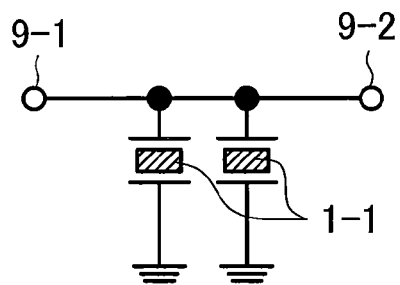
FIG. 27 is an equivalent circuit diagram of a highpass filter to explain an eighth embodiment of the present invention.

As shown in the equivalent circuit of FIG. 27, this embodiment is a highpass filter composed of a signal line between input-output terminals 9-1 and 9-2 and two parallel arm resonators 1-1 connected between the signal line and earth. The two parallel arm resonators 1-1 are resonators shown in the first embodiment of the present invention which are set to different covering ratios, these resonators have different resonant frequencies.

Figure 28A:
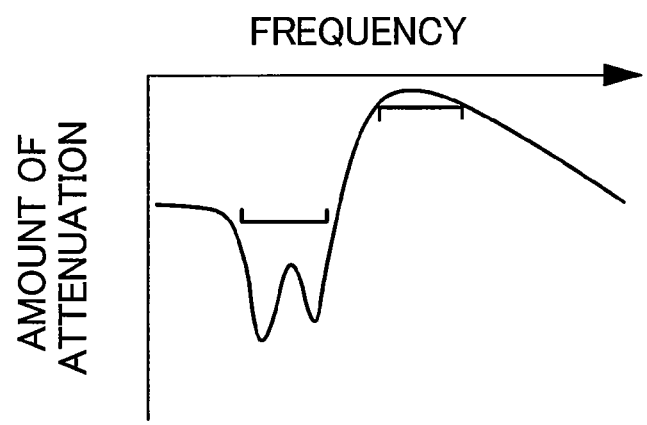
FIG. 28A is a frequency characteristic diagram of a highpass filter of the eighth embodiment of the present invention.
Figure 28B:
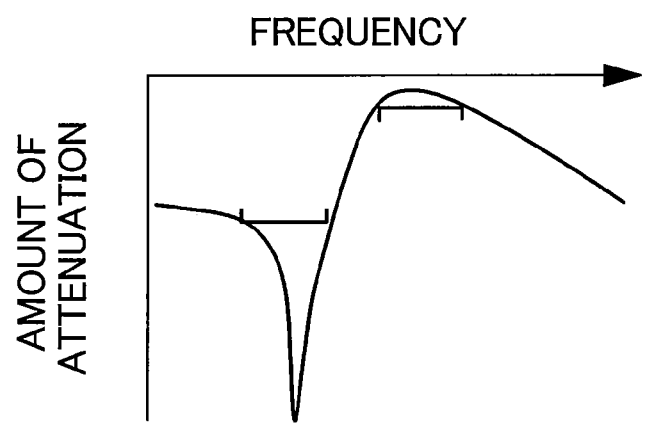
FIG. 28B is a frequency characteristic diagram of a highpass filter implemented with a single resonator for comparison.

FIG. 28A shows the frequency characteristic of the eighth embodiment of the present invention. Since a frequency whose attenuation amount sharply decreases form the series resonant frequency to parallel resonant frequency of the parallel arm resonator is matched to a frequency at the edge of the low-frequency side of pass band, this embodiment functions as a highpass filter.

Since the stopband width of a highpass filter is determined by the series resonant frequency of the two parallel arm resonators 1-1, it is necessary to control the stopband width with extremely high precision. In the present invention, the covering ratios of the two parallel arm resonators 1-1 are set to different values. The difference in covering ratio can be controlled by the covering ratio of the pattern on the photomask and the difference in covering ratio on the photomask can be produced with almost zero error, and consequently the bandwidth of the highpass filter of the eighth embodiment of the present invention can be set precisely enough to be able to almost completely ignore the variation between wafers or within a wafer during fabrication. Hence, the guaranteed filter characteristics taking into account the process variation improves dramatically.

As a comparative example, a highpass filter can be realized with only one parallel arm resonator 1-1. However, the highpass filter using one parallel arm resonator like the comparative example has a frequency characteristic as shown in FIG. 28B, and the peak attenuation amount in the stopband width is excellent but the stopband is narrow and therefore the minimum attenuation amount within the stopband remarkably deteriorates. Furthermore, if the technology disclosed in U.S. Pat. No. 6,617,249B2 and the like is used, it is expected that an electrical characteristic similar to the eighth embodiment of the present invention can be achieved. In the eighth embodiment of the present invention, the number of layers of film is one less than the resonator disclosed in U.S. Pat. No. 6,617,249B2 and the like, and hence this embodiment can be fabricated with fewer steps and at lower cost. Also, as a method of making the resonant frequencies of the two parallel arm resonators different from each other, a method of using inductance is conceivable. By setting the resonant frequencies of the parallel arm resonators to the same value and inserting inductances with different values between each resonator and earth, it is possible to shift an effective serial resonant frequency to the low-frequency side. Although this method allow the filter to be fabricated with fewer steps and at lower cost since the number of layers of film is one less than the resonator disclosed the above patent document, the inductance fabricated on the wafer generally suffers a large loss and requires a special process to reduce the loss, thus making it difficult to achieve low cost and low loss at the same time. It is possible to reduce the loss to some extent by installing an inductance outside the wafer, but additional cost and increased area is required for installing the inductance outside the wafer.

From the foregoing, in the highpass filter using the embodiment of the present invention described above, it is possible to provide an inexpensive filter with dramatically improved frequency characteristic by use of a plurality of parallel arm resonators having different covering ratios.

Embodiment 9

A low pass filter according to a ninth embodiment of the present invention is described with reference to FIGS. 29 to 30B.

Figure 29:
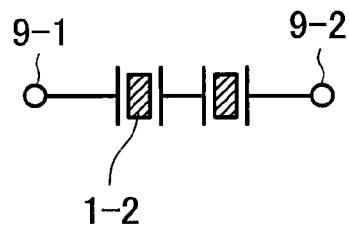
FIG. 29 is an equivalent circuit diagram of a filter to explain a ninth embodiment of the present invention.

As shown in the equivalent circuit in FIG. 29, this embodiment is a lowpass filter wherein two resonators are connected in series to a series arm, and is composed of two series arm resonators 1-2 connected to input-output terminals. The two series arm resonators are the resonators shown in the first embodiment of the present invention and set to different covering ratios, and therefore have different resonant frequencies.

Figure 30A:
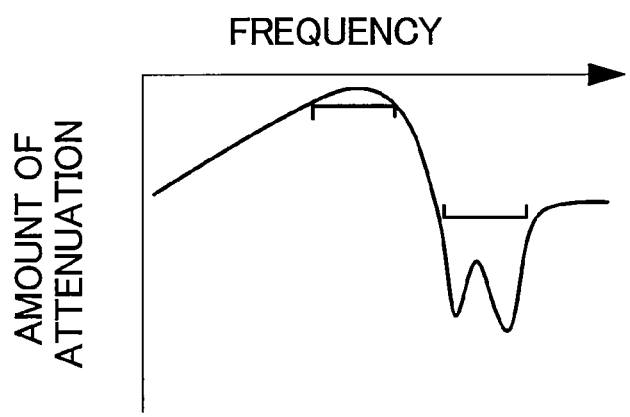
FIG. 30A is a frequency characteristic diagram of a lowpass filter of the ninth embodiment of the present invention.
Figure 30B:
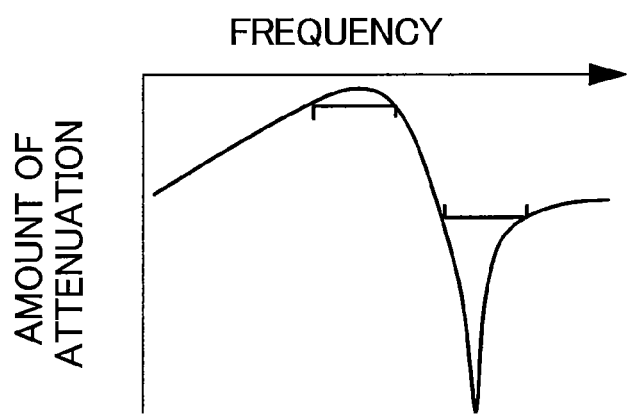
FIG. 30B is a frequency characteristic diagram of a lowpass filter implemented with a single resonator for comparison.

FIG. 30A shows a frequency characteristic of the ninth embodiment. Since the frequency whose attenuation amount sharply decrease from the series resonant frequency to parallel resonant frequency of the series art resonator is matched to a frequency of the edge of the radio-frequency side of the pass band, this embodiment functions as a lowpass filter.

The stopband width of a lowpass filter is determined by the parallel resonant frequency of the two series arm resonators 1-2, and hence the stopband width must be controlled with extremely high precision. In the present invention, the covering ratios of the two series arm resonators are set to different values. The difference in covering ratio σ can be controlled by the covering ratio of the pattern on the photomask and the difference in covering ratio on the photomask can be produced with almost zero error, and consequently the bandwidth of the lowpass filter of the ninth embodiment of the present invention can be set precisely enough to be able to almost completely ignore the variation between wafers or within a wafer during fabrication. Hence, the guaranteed filter characteristics taking into account the process variation improves dramatically.

It is possible to realize a lowpass filter with only one series arm resonator. However, although the peal attenuation amount is excellent in the case of one series arm resonator as shown in a comparative example of FIG. 30B, the stopband is narrow and hence the minimum attenuation amount within the stopband deteriorates remarkably. Also, if the technology disclosed in U.S. Pat. No. 6,617,249B2 and the like is used or an inductance is used, it can be expected that an electrical characteristic similar to the ninth embodiment of the present invention can be realized. However, as described in the eighth embodiment of the present invention, achieving low cost and low loss at the same time is difficult and rather high cost and increased area will result.

From the foregoing, in the lowpass filter according to the fourth embodiment of the present invention, it is possible to provide an inexpensive filter with dramatically improved frequency characteristic by use of a plurality of serial arm resonators having different covering ratios.

Embodiment 10

Figure 31:
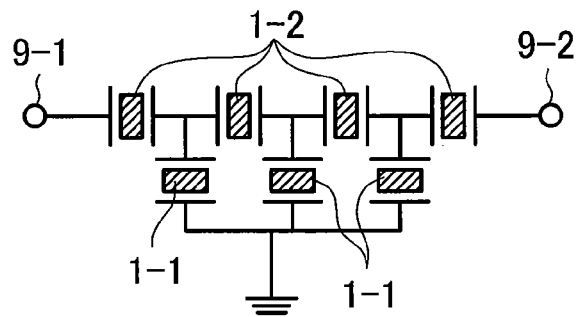
FIG. 31 is an equivalent circuit diagram of a filter to explain a tenth embodiment of the present invention.
Figure 32:
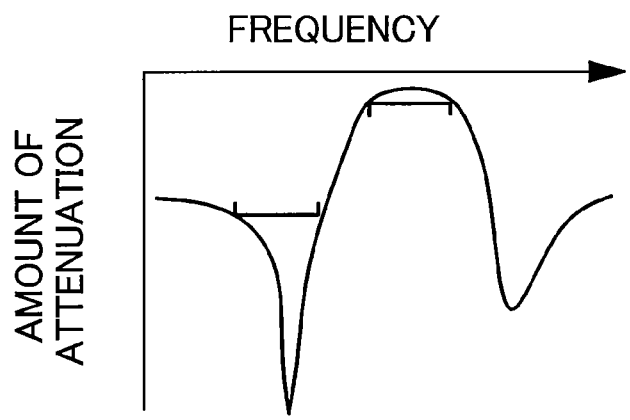
FIG. 32 is a frequency characteristic diagram of a band pass filter of the tenth embodiment of the present invention.

A band pass filter according to a tenth embodiment of the present invention is described with reference to FIGS. 31 and 32. FIG. 31 shows an equivalent circuit to illustrate the tenth embodiment. FIG. 32 shows a frequency characteristic of the band pass filter of the eighth embodiment shown in FIG. 31.

This embodiment is a ladder band pass filter connecting seven thin film piezoelectric bulk acoustic wave resonators shown in, for example, the first embodiment of the present invention, and is composed of four series arm resonators 1-2 connected in series between input-output terminals and three parallel arm resonators 1-1 connected to earth. Since different covering ratios are set for the series arm resonator 1-2 and the parallel arm resonator 1-1, they have different resonant frequencies.

FIG. 32 shows a frequency characteristic of the tenth embodiment. Since a frequency whose attenuation amount sharply decreases from the series resonant frequency to parallel resonant frequency of the series arm resonator 1-2 is matched to a frequency at the edge of radio-frequency side of the pass band, and a frequency whose attenuation amount sharply decreases from the series resonant frequency to parallel resonant frequency of the parallel arm resonator 1-1 is matched to a frequency at the edge of low-frequency side of the pass band, this embodiment functions as a ladder band pass filter.

Since the pass band width of a band pass filter is determined by the frequency difference between the series arm resonator 1-2 and the parallel arm resonator 1-1, it is necessary to control the pass band with extremely high precision. In this embodiment, the covering ratio of the series arm resonator 1-2 is set lower than that of the parallel arm resonator 1-1. The difference in covering ratio can be controlled by the covering ratio of the pattern on the photomask and the difference in covering ratio on the photomask can be produced with almost zero error, and consequently the bandwidth of the band pass filter of the seventh embodiment of the present invention can be set precisely enough to be able to almost completely ignore the variation between wafers or within a wafer during fabrication. Hence, the guaranteed filter characteristics taking into account the process variation improves dramatically. Also, since the number of layers of film is one layer less than the resonator disclosed in U.S. Pat. No. 6,617, 249B2, it is possible to fabricate the resonator with fewer steps and at lower cost.

From the foregoing, in the ladder band pass filter using the first embodiment or the like of the present invention, it is possible to provide an inexpensive filter with dramatically improved frequency characteristics by increasing the covering ratio of the parallel arm resonator 1-1 than that of the series arm resonator 1-2.

In the ladder band pass filter of the tenth embodiment of the present invention, by setting the three parallel arm resonators 1-1 to different covering ratios it is possible to further improve frequency characteristic.

Embodiment 11

Figure 33:
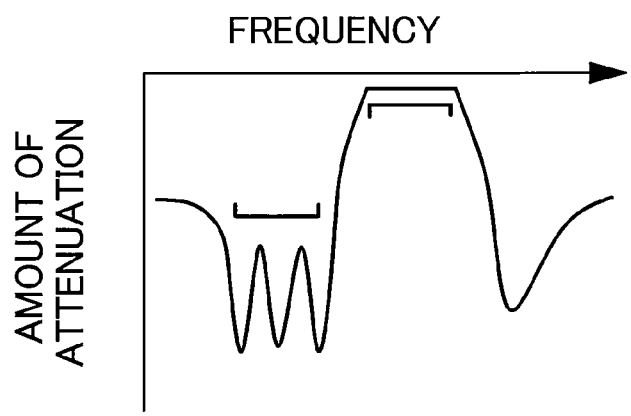
FIG. 33 is a frequency characteristic diagram of a band pass filter of an eleventh embodiment of the present invention.

A band pass filter according to an eleventh embodiment of the present invention is described with referent to FIG. 33. The equivalent circuit of this embodiment is the same as the equivalent circuit of the tenth embodiment. This embodiment differs from the tenth embodiment in that the covering ratios of the three parallel arm resonators 1-1 are different. FIG. 33 shows a frequency characteristic of the eleventh embodiment. Like the tenth embodiment, a frequency whose attenuation amount sharply decreases from the series resonant frequency to parallel resonant frequency of the series arm resonator 1-2 is matched to a frequency at the edge of the radio-frequency side of the pass band, and a frequency whose attenuation amount sharply decreases from the series resonant frequency to parallel resonant frequency of the parallel arm resonator 1-1 is matched to a frequency at the edge of the low-frequency side of the pass band, and hence this embodiment functions as a ladder band pass filter.

Unlike the tenth embodiment, the stopband width of the low-frequency side of the band pass filter is made wider than the three parallel arm resonators. Therefore, compared with the tenth embodiment the peak attenuation amount of the stopband is deteriorated, but broadening of the stopband is realized, leading to a remarkable improvement in minimum attenuation amount within the stopband.

Since the stopband width at the low-frequency side of the band pass filter is determined by the series resonant frequency of the three parallel arm resonators 1-1, it is necessary to control with extremely high precision. In the present invention, the covering ratios of the three parallel arm resonators 1-1 are set to different values. The difference in covering ratio σ can be controlled by the covering ratio of the pattern on the photomask and the difference in covering ratio on the photomask can be produced with almost zero error, and consequently the bandwidth of the band pass filter of the tenth embodiment of the present invention can be set precisely enough to be able to almost completely ignore the variation between wafers or within a wafer during fabrication by employing the eleventh embodiment. Hence, the guaranteed filter characteristics taking into account the process variation improves dramatically.

Also, if the technology disclosed in U.S. Pat. No. 6,617,249B2 and the like is used or an inductance is used, it can be expected that an electrical characteristic similar to the ninth embodiment of the present invention can be realized. However, as described in the eighth embodiment of the present invention, achieving low cost and low loss at the same time is difficult and rather high cost and increased area will result.

From the foregoing, like the eleventh embodiment, in the ladder band pass filter using an embodiment of the present invention, it is possible to provide an inexpensive filter with dramatically improved frequency characteristic by use of a plurality of parallel arm resonators 1-1 having different covering ratios.

Embodiment 12

A ladder band pass filter according to a twelfth embodiment of the present invention is described with reference to FIGS. 34 and 35.

Figure 34:
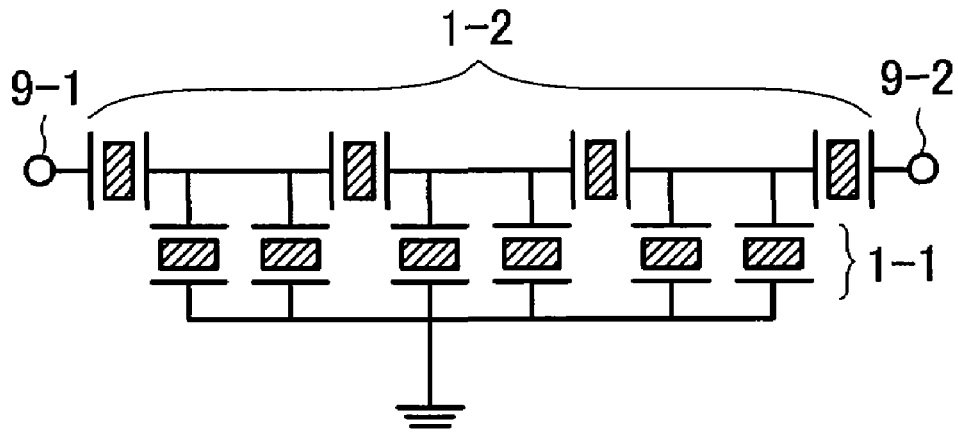
FIG. 34 is an equivalent circuit diagram of a filter to explain a twelfth embodiment of the present invention.

FIG. 34 shows an equivalent circuit according to a twelfth embodiment of the present invention. This embodiment is a ladder band pass filter connecting the 10 thin film piezoelectric bulk acoustic wave resonators 1 shown in the first embodiment of the present invention, wherein the three parallel resonators 1-1 of the ladder band pass filter shown in the eleventh embodiment of the present invention are each divided into two and these six resonators are set to different covering ratios.

Figure 35:
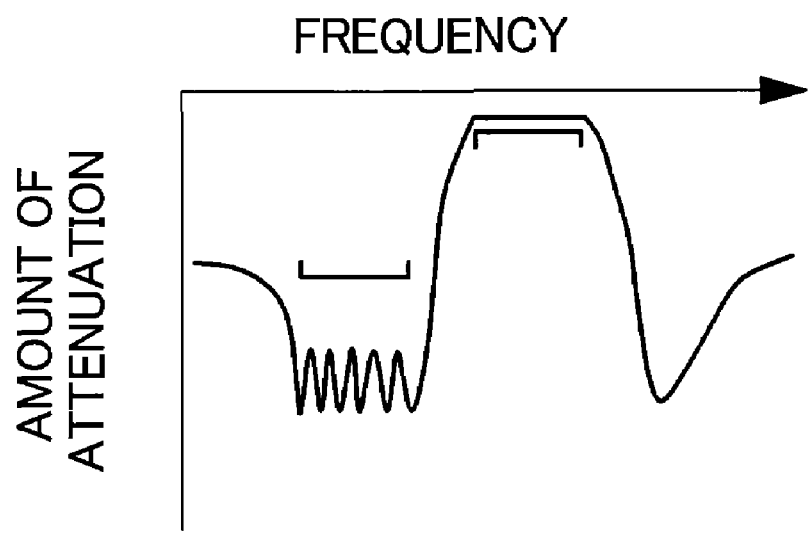
FIG. 35 is a frequency characteristic of a band pass filter of the twelfth embodiment of the present invention.

FIG. 35 shows a frequency characteristic of the twelfth embodiment. Like the eleventh embodiment of the present invention, since a frequency whose attenuation amount sharply decreases from the series resonant frequency to parallel resonant frequency of the series arm resonator 1-2 is matched to a frequency at the edge of radio-frequency side of the pass band, and a frequency whose attenuation amount sharply decreases from the series resonant frequency to parallel resonant frequency of the parallel arm resonator 1-1 is matched to a frequency at the edge of low-frequency side of the pass band, this embodiment functions as a ladder band pass filter.

The stopband width at the low-frequency side of the band pass filter is broadened by the six parallel arm resonators. Compared with the eleventh embodiment of the present invention, the peak attenuation amount is deteriorated but broadening of the stopband is realized, thus leading to a remarkable improvement in the minimum attenuation amount within the stopband.

From the foregoing, in the ladder band pass filter using the first embodiment of the present invention, it is possible to provide an inexpensive filter with dramatically improved frequency characteristic by dividing each of the parallel arm resonators 1-1 and using a plurality of parallel arm resonators 1-1 having different covering ratios.

Embodiment 13

Figure 36:
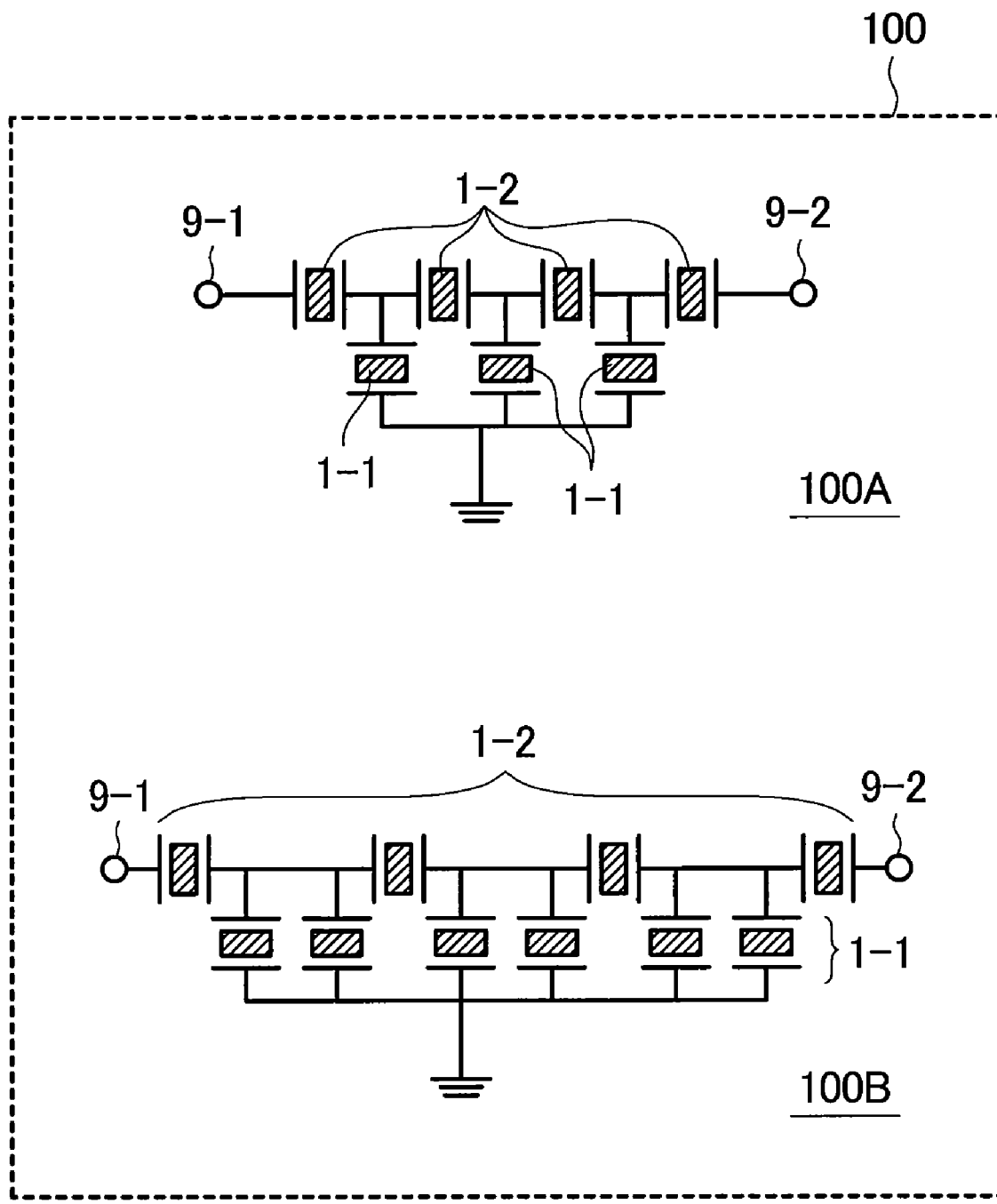
FIG. 36 is a circuit diagram to explain a ladder band pass filter of a thirteenth embodiment of the present invention.

A ladder band pass filter according to a thirteenth embodiment of the present invention is described with reference to FIGS. 36, 37A and 37B. FIG. 36 shows an equivalent circuit of the thirteenth embodiment. For convenience, a filter whose main stopband is located at the radio-frequency side of the pass band is referred to as a transmission filter and a filter whose main stopband is otherwise located is referred to as a reception filter herein.

In the ladder band pass filter 100 of this embodiment, two ladder band pass filters for branching filter (a transmission filter and a reception filter) 100A and 100B composed of the seventeen thin film piezoelectric bulk acoustic wave resonators 1 shown in the first embodiment and the like are formed on the same substrate. The seventeen resonators 1 constituting the ladder band pass filter 100 are set to different covering ratios for optimization of the frequency characteristic.

Figure 37A:
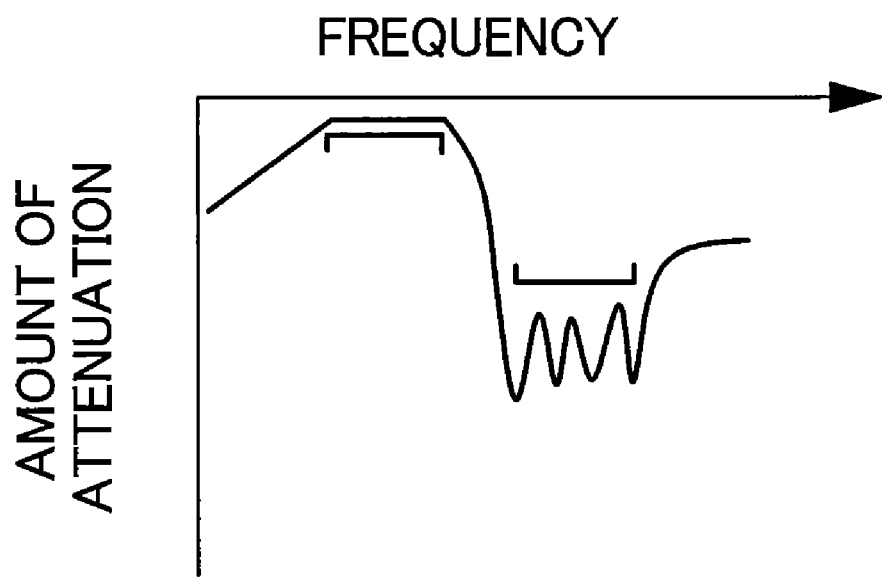
FIG. 37A is a frequency characteristic diagram of a transmission filter of the thirteenth embodiment of the present invention.
Figure 37B:
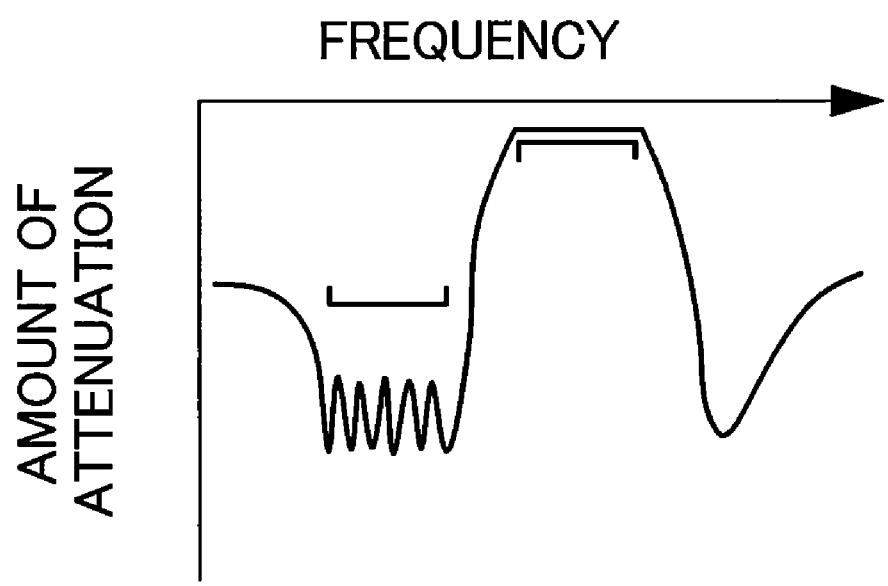
FIG. 37B is a frequency characteristic diagram of a reception filter of the thirteenth embodiment of the present invention.

FIGS. 37A and 37B show a frequency characteristic of the thirteenth embodiment. FIG. 37A shows the frequency characteristic of the transmission filter and FIG. 37B shows that of the reception filter.

Since the transmission filter and the reception filter have different frequencies, their covering ratios are independently optimized in order to optimize the respective series arm resonator 1-2 and parallel arm resonator 1-1 to respective pass frequency band.

In the transmission filter 100A, like the eleventh embodiment of the present invention, the series arm resonator 1-2 and the parallel arm resonator 1-1 are set to different covering ratios and hence have different frequencies. As shown in FIG. 37A, a frequency whose attenuation amount sharply decreases from the series resonant frequency to parallel resonant frequency of the series arm resonator 1-2 is matched to a frequency at the edge of the radio-frequency side of the pass band. Also, a frequency whose attenuation amount sharply decreases from the series resonant frequency to parallel resonant frequency of the parallel arm resonator 1-1 is matched to a frequency at the edge of the low-frequency side of the pass band. Furthermore, in order to broaden the stopband width at the radio-frequency side, the four series arm resonators 1-2 are set to different covering ratios.

In the reception filter, like the eleventh embodiment of the present invention, the series arm resonator 1-2 and the parallel arm resonator 1-1 are set to different covering ratios and hence have different frequencies. As shown in FIG. 37B, a frequency whose attenuation amount sharply decreases from the series resonant frequency to parallel resonant frequency of the series arm resonator 1-2 is matched to a frequency at the edge of the radio-frequency side of the pass band, and a frequency whose attenuation amount sharply decreases from the series resonant frequency to parallel resonant frequency of the parallel arm resonator 1-1 is matched to a frequency at the edge of the low-frequency side of the pass band. Therefore, this filter functions as a ladder band pass filter. Furthermore, in order to broaden the stopband width at the low-frequency side, the six parallel arm resonators 1-1 are set to different covering ratios.

From the foregoing, it is possible to provide an inexpensive branching filter with dramatically improved frequency characteristic by use of the thirteenth embodiment of the present invention.

Embodiment 14

Although the seventh through thirteenth embodiments of the present invention are described using a resonator shown in the first embodiment of the present invention, it is obvious that similar advantages can also be obtained with a resonator shown in the second through fourth embodiments of the present invention. Also, the previous embodiments are described mainly with an FBAR type resonator, but obviously similar advantages can be obtained with an SMR type resonator. Furthermore, vibration mode is not restricted to the thickness expansion and contraction mode.

All the previous embodiments of the present invention are described based on the structure of forming holes 7 on the top electrode 3, but a similar advantage can also be obtained by forming holes 7 on the bottom electrode 4. However, if holes 7 are formed on the electrode that is initially coated during the coating process, the base of the piezoelectric thin film 5 becomes irregular and the film quality deteriorates. In view of the film quality, it is preferable to form holes 7 on the top electrode 3 that is coated after the piezoelectric thin film 5.

Also, in the first through fourth embodiments of the present invention, one layer of the piezoelectric thin film 5 is sandwiched between the top electrode 3 and bottom electrode 4, but the piezoelectric material 5 is not restricted to this configuration. The piezoelectric material 5 may be composed of many layers of piezoelectric thin films or a non-piezoelectric film may be sandwiched between upper and lower piezoelectric thin films. However, the piezoelectric material 5 must include at least one layer of piezoelectric thin film.

Embodiment 15

Figure 38:
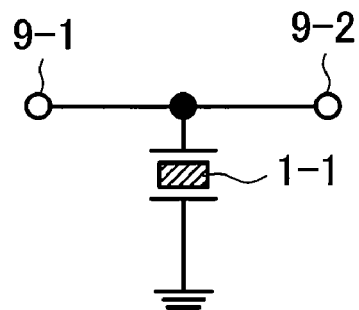
FIG. 38 is an equivalent circuit diagram of a filter to explain a fourteenth embodiment of the present invention.
Figure 39:
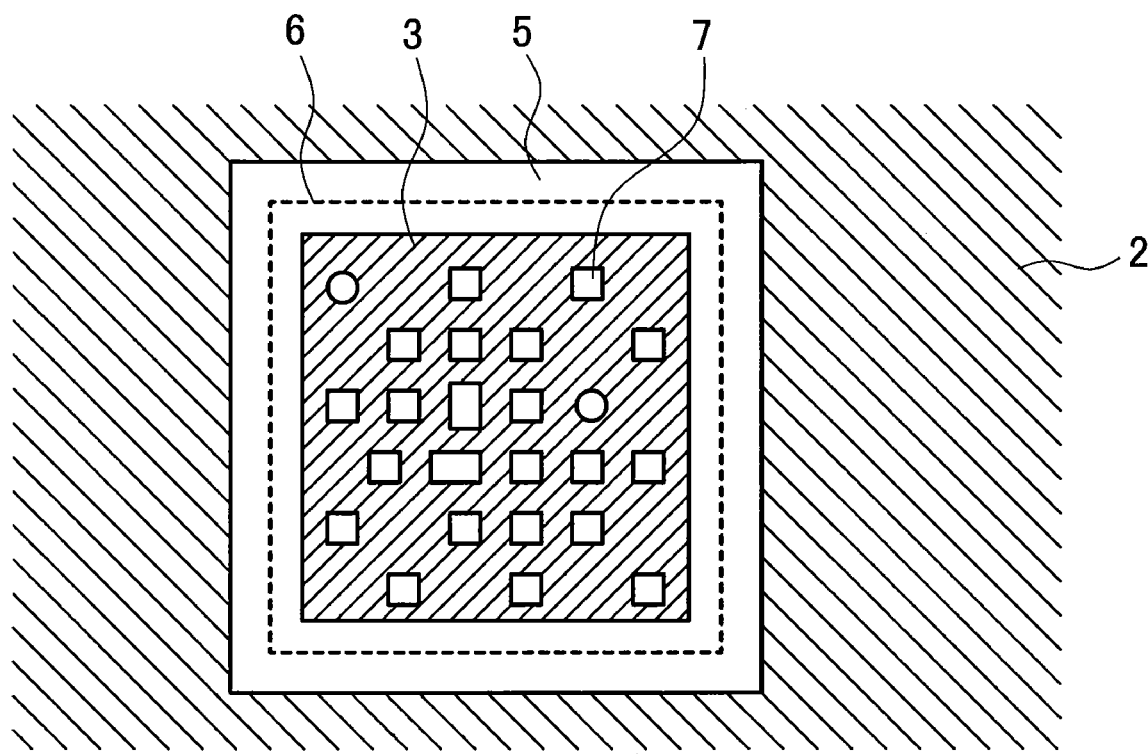
FIG. 39 is a frequency characteristic diagram of a highpass filter of the fourteenth embodiment of the present invention.
Figure 40:
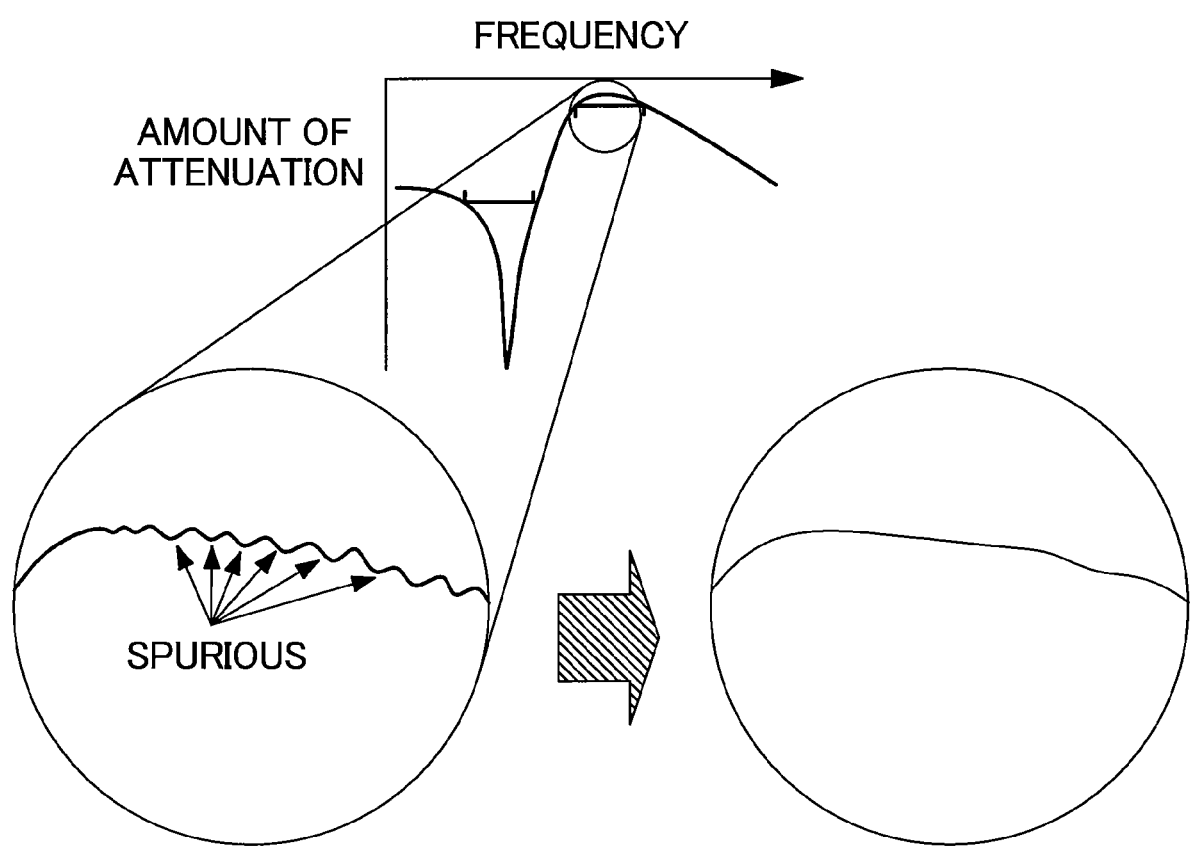
FIG. 40 is a schematic diagram showing an advantage of the first embodiment of the present invention.

A filter according to a fifteenth embodiment of the present invention is described with reference to FIGS. 38 through 40. FIG. 38 is a plan view of a thin film piezoelectric bulk acoustic wave resonator 1 to be employed for the highpass filter of the fifteenth embodiment. FIG. 39 shows a frequency characteristic of the highpass filter of this embodiment. FIG. 40 is a schematic diagram showing an advantage of embodiment 15.

As described above, if a hole is smaller the wavelength of an acoustic wave, the acoustic wave cannot recognize the shape of the hole, and hence even if all the shape and pitch of holes 7 are not the same, an equivalent advantage can be obtained as long as the covering ratio s satisfies the condition $0<\sigma<1$ is for every pitch P of $0.64\,\lambda$.

In the fifteenth embodiment, as shown in FIG. 39, the shape and pitch of the holes 7 formed on the opposite area of the electrode plane of the top electrode 3 are positively distributed. That is, the effective density (covering ratio σ) is gradually increased from the center to the periphery of the top electrode 3. Ideally, density function should be analogous to sine function. This causes a frequency between the series resonant frequency and parallel resonant frequency to take the form of sine function wherein the excitation strength is maximized at the center as shown in FIG. 40, resulting in an additional advantage that spurious waves can be suppressed at that frequency.

Embodiment 16

Figure 41:
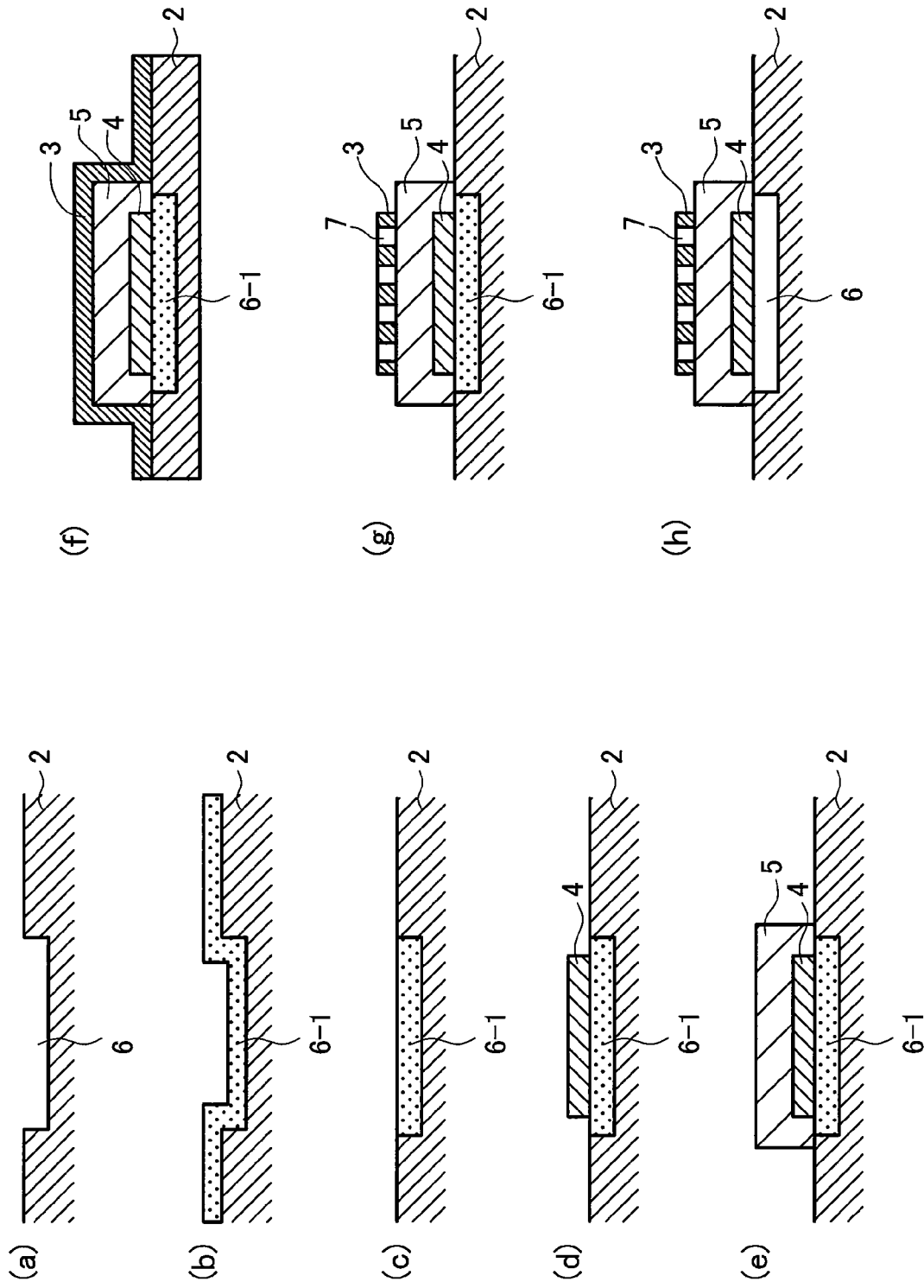
FIG. 41 is a cross sectional view to explain the fabrication method of the first embodiment of the present invention.

FIG. 41 shows an example of fabrication method according to the first embodiment of the present invention.

A gap 6 is formed on the isolating substrate 2 (a) and then a sacrifice layer 6-1 is formed (b). Other than gap 6 portion of the sacrifice layer 6-1 is removed (c), and the coating and patterning of the bottom electrode 4 is performed (d). Likewise, the coating and patterning of the piezoelectric thin film 5 (e) and the coating (f) and patterning (g) of the top electrode 3 are performed. Finally, the sacrifice layer is removed (h).

As coating equipment, a sputtering apparatus, deposition apparatus, CVD apparatus, or the like are used. As patterning equipment, plasma etching apparatus or the like is used.

According to the present invention, it is possible to fine-tune a resonant frequency by patterning a structure formed on the first metal thin film with the photomask and exposure process. Also, when forming resonators with different resonant frequencies on the same substrate, it is not necessary to increase the number of steps for fabricating a filter, leading to cost reduction.

What is claimed is:

1. A thin film piezoelectric bulk acoustic wave resonator having a laminated structure, said laminated structure comprising:
    a piezoelectric thin film;
    a first metal electrode film; and
    a second metal electrode film, wherein between the first and the second metal electrode films at least part of the piezoelectric thin film is sandwiched,
    wherein the first metal electrode film has a hole structure including a plurality of holes, and
    wherein the holes extend into the piezoelectric thin film, and have a depth equivalent to a combined thickness of the first metal electrode film and the piezoelectric thin film,
    whereby the resonator has a resonant frequency at which an acoustic wave excited by the piezoelectric thin film cannot identify the holes of the hole structure individually.

2. The thin film piezoelectric bulk acoustic wave resonator according to claim 1,
    wherein assuming that the wavelength of an elastic wave excited by the piezoelectric thin film is λ, the covering ratio σ of an opposite area of an electrode plane of the first metal electrode film facing an electrode plane of the second metal electrode film satisfies a condition $0<\sigma<1$ for every $0.64\,\lambda$ pitch.

3. The thin film piezoelectric bulk acoustic wave resonator according to claim 1,
    wherein the holes are dispersed over an opposite area of an electrode plane of the first metal electrode film facing an electrode plane of the second metal electrode film.

4. The thin film piezoelectric bulk acoustic wave resonator according to claim 1,
    wherein the piezoelectric thin film has at least one layer of piezoelectric thin film formed by a coating apparatus.

5. The thin film piezoelectric bulk acoustic wave resonator according to claim 2,
    wherein the covering ratio σ of the first metal electrode film is fixed for every pitch P of $0.64\,\lambda$ in the opposite area.

6. The thin film piezoelectric bulk acoustic wave resonator according to claim 2,
    wherein the covering ratio a of the first metal electrode film is changed for every pitch P of $0.64\,\lambda$ in the opposite area.

7. The thin film piezoelectric bulk acoustic wave resonator according to claim 1,
    wherein both of the first metal electrode film and the second metal electrode film are formed by a coating apparatus, and both have electrical extraction lines.

8. A thin film piezoelectric bulk acoustic wave resonator having a laminated structure, said laminated structure comprising:
a piezoelectric thin film;
a first metal electrode film; and
a second metal electrode film, wherein between the first and the second metal electrode films at least part of the piezoelectric thin film is sandwiched,
wherein the first metal electrode film has a hole structure including a plurality of holes,
wherein, if a combined thickness of the first metal electrode film, the second metal electrode film, and the piezoelectric thin film is ht, the covering ratio σ of an opposite area of the first metal electrode film facing the second metal electrode film satisfies the condition 0<σ<1 for every 1.28 ht pitch, and
wherein the holes extend into the piezoelectric thin film, and have a depth equivalent to a combined thickness of the first metal electrode film and the piezoelectric thin film.

9. The thin film piezoelectric bulk acoustic wave resonator according to claim 8,
wherein the covering ratio σ of the first metal electrode film is fixed for every pitch P of 0.64 λ in the opposite area.

10. The thin film piezoelectric bulk acoustic wave resonator according to claim 8,
wherein the piezoelectric thin film has at least one layer of piezoelectric thin film formed with a coating apparatus, and
wherein both of the first metal electrode film and the second metal electrode film are formed with a coating apparatus, and both have electrical extraction lines.

11. A radio frequency filter comprising:
an input terminal;
an output terminal; and
at least one thin film piezoelectric bulk acoustic wave resonator connected to the input terminal and the output terminal,
wherein the thin film piezoelectric bulk acoustic wave resonator includes a laminated structure, said laminated structure comprising:
a piezoelectric thin film;
a first metal electrode film; and
a second metal electrode film, wherein between the first and the second metal electrode films at least part of the piezoelectric thin film is sandwiched,
wherein the first metal electrode film has a hole structure including a plurality of holes, and
wherein the holes extend into the piezoelectric thin film, and have a depth equivalent to a combined thickness of the first metal electrode film and the piezoelectric thin film,
whereby the resonator has a resonant frequency at which an acoustic wave excited by the piezoelectric thin film cannot identify the holes of the hole structure individually.

12. The radio frequency filter according to claim 11, further comprising:
a first thin film piezoelectric bulk acoustic wave resonator including the thin film piezoelectric bulk acoustic wave resonator connected to a series arm for the input terminal and the output terminal; and
a second thin film piezoelectric bulk acoustic wave resonator connected to a parallel arm,
wherein assuming that the wavelength of an elastic wave excited by the piezoelectric thin film is λ, the covering ratio σ of an opposite area of the second metal electrode film facing the first metal electrode film satisfies the condition 0<σ<1 for every 0.64 λ pitch.

13. The radio frequency filter according to claim 12, further comprising:
a first thin film piezoelectric bulk acoustic wave resonator including the thin film piezoelectric bulk acoustic wave resonator connected to a series arm for the input terminal and the output terminal; and
a second thin film piezoelectric bulk acoustic wave resonator including the thin film piezoelectric bulk acoustic wave resonator connected to a parallel arm,
wherein the covering ratio of the first thin film piezoelectric bulk acoustic wave resonator is less than that of the second thin film piezoelectric bulk acoustic wave resonator.

14. The radio frequency filter according to claim 11, further comprising a plurality of the thin film piezoelectric bulk acoustic wave resonators connected to a parallel arm for the input terminal and the output terminal,
wherein the covering ratio of at least one of the plurality of thin film piezoelectric bulk acoustic wave resonators is different from that of the other thin film piezoelectric bulk acoustic wave resonators.

15. The radio frequency filter according to claim 11, further comprising a plurality of the thin film piezoelectric bulk acoustic wave resonators connected to a series arm for the input terminal and the output terminal,
wherein at least one of the plurality of thin film piezoelectric bulk acoustic wave resonators has a covering ratio different from that of the other thin film piezoelectric bulk acoustic wave resonators.

16. The radio frequency filter according to claim 11, further comprising:
a plurality of first thin film piezoelectric bulk acoustic wave resonators connected to a series arm for the input terminal and the output terminal; and
a plurality of second thin film piezoelectric bulk acoustic wave resonators connected to multiple parallel arms,
wherein all of the first thin film piezoelectric bulk acoustic wave resonators connected to the series arm are the thin film piezoelectric bulk acoustic wave resonators.

17. The radio frequency filter according to claim 16,
wherein all of the second thin film piezoelectric bulk acoustic wave resonators are the thin film piezoelectric bulk acoustic wave resonators, and
wherein the covering ratio of the first thin film piezoelectric bulk acoustic wave resonators is less than that of the second thin film piezoelectric bulk acoustic wave resonators.

18. The radio frequency filter according to claim 17,
wherein the covering ratio of at least one of the second thin film piezoelectric bulk acoustic wave resonators differs from that of the other second thin film piezoelectric bulk acoustic wave resonators.

* * * * *